US012604549B2

(12) United States Patent
Yang et al.

(10) Patent No.: US 12,604,549 B2
(45) Date of Patent: Apr. 14, 2026

(54) SEMICONDUCTOR IMAGE-SENSING STRUCTURE AND METHOD FOR MANUFACTURING THE SAME

(71) Applicant: TAIWAN SEMICONDUCTOR MANUFACTURING COMPANY LTD., Hsinchu (TW)

(72) Inventors: Ming-Hsien Yang, Taichung City (TW); Chun-Liang Lu, Tainan City (TW); Chun-Hao Chou, Tainan City (TW); Kuo-Cheng Lee, Tainan City (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 664 days.

(21) Appl. No.: 17/818,387

(22) Filed: Aug. 9, 2022

(65) Prior Publication Data

US 2024/0055452 A1     Feb. 15, 2024

(51) Int. Cl.
*H10F 39/00*     (2025.01)
*H10F 39/18*     (2025.01)

(52) U.S. Cl.
CPC ......... *H10F 39/805* (2025.01); *H10F 39/024* (2025.01); *H10F 39/182* (2025.01); *H10F 39/8053* (2025.01); *H10F 39/8063* (2025.01); *H10F 39/807* (2025.01)

(58) Field of Classification Search
CPC .... H10F 39/805; H10F 39/024; H10F 39/182; H10F 39/8053; H10F 39/8063; H10F 39/807; H10F 39/014
See application file for complete search history.

(56) References Cited

U.S. PATENT DOCUMENTS

| | | | | |
|---|---|---|---|---|
| 2013/0299886 | A1* | 11/2013 | Chuang | H10F 39/811 |
| | | | | 257/292 |
| 2018/0151615 | A1* | 5/2018 | Wen | H10F 39/199 |
| 2018/0240835 | A1* | 8/2018 | Wu | H10F 39/024 |
| 2018/0337211 | A1* | 11/2018 | Su | H10F 39/199 |
| 2019/0165026 | A1* | 5/2019 | Kuo | H10F 39/807 |
| 2021/0288094 | A1* | 9/2021 | Lee | H10F 39/805 |
| 2022/0328557 | A1* | 10/2022 | Park | H10F 39/8053 |
| 2023/0317751 | A1* | 10/2023 | Ho | H10F 39/8063 |
| | | | | 257/432 |

* cited by examiner

*Primary Examiner* — William B Partridge
*Assistant Examiner* — Erik A. Anderson
(74) *Attorney, Agent, or Firm* — WPAT LAW; Anthony King

(57)     ABSTRACT

A semiconductor image sensing structure includes a substrate, an isolation structure, an anti-reflection structure, at least one optical element and a transistor. The substrate has at least one photodiode region. The isolation structure is disposed in the substrate and surrounds the photodiode region. The anti-reflection structure covers the photodiode region. The optical element is disposed over the anti-reflection structure and corresponds to the photodiode region. The transistor is disposed under the photodiode region.

20 Claims, 23 Drawing Sheets

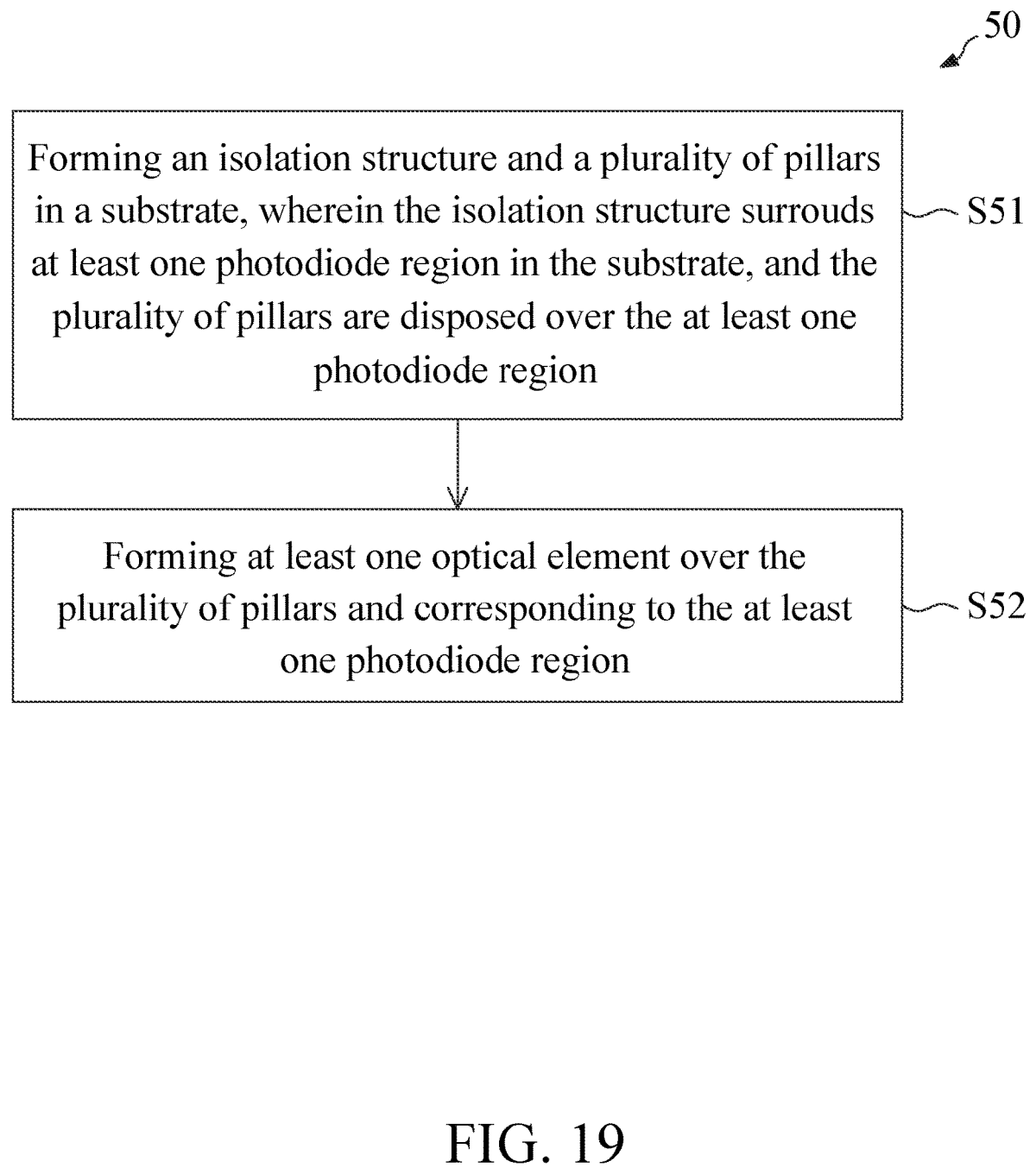

Forming an isolation structure and a plurality of pillars in a substrate, wherein the isolation structure surrouds at least one photodiode region in the substrate, and the plurality of pillars are disposed over the at least one photodiode region — S51

Forming at least one optical element over the plurality of pillars and corresponding to the at least one photodiode region — S52

FIG. 19

SEMICONDUCTOR IMAGE-SENSING STRUCTURE AND METHOD FOR MANUFACTURING THE SAME

BACKGROUND

Semiconductor image sensors are used to sense radiation, such as light. Complementary metal-oxide-semiconductor (CMOS) image sensors (CIS) are widely used in various applications, such as digital cameras and mobile phone cameras. Such cameras utilize an array of pixels located in a substrate, including photodiodes and transistors that can absorb radiation projected toward the substrate and convert the sensed radiation into electrical signals.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features may be arbitrarily increased or reduced for clarity of discussion.

Figure 1:
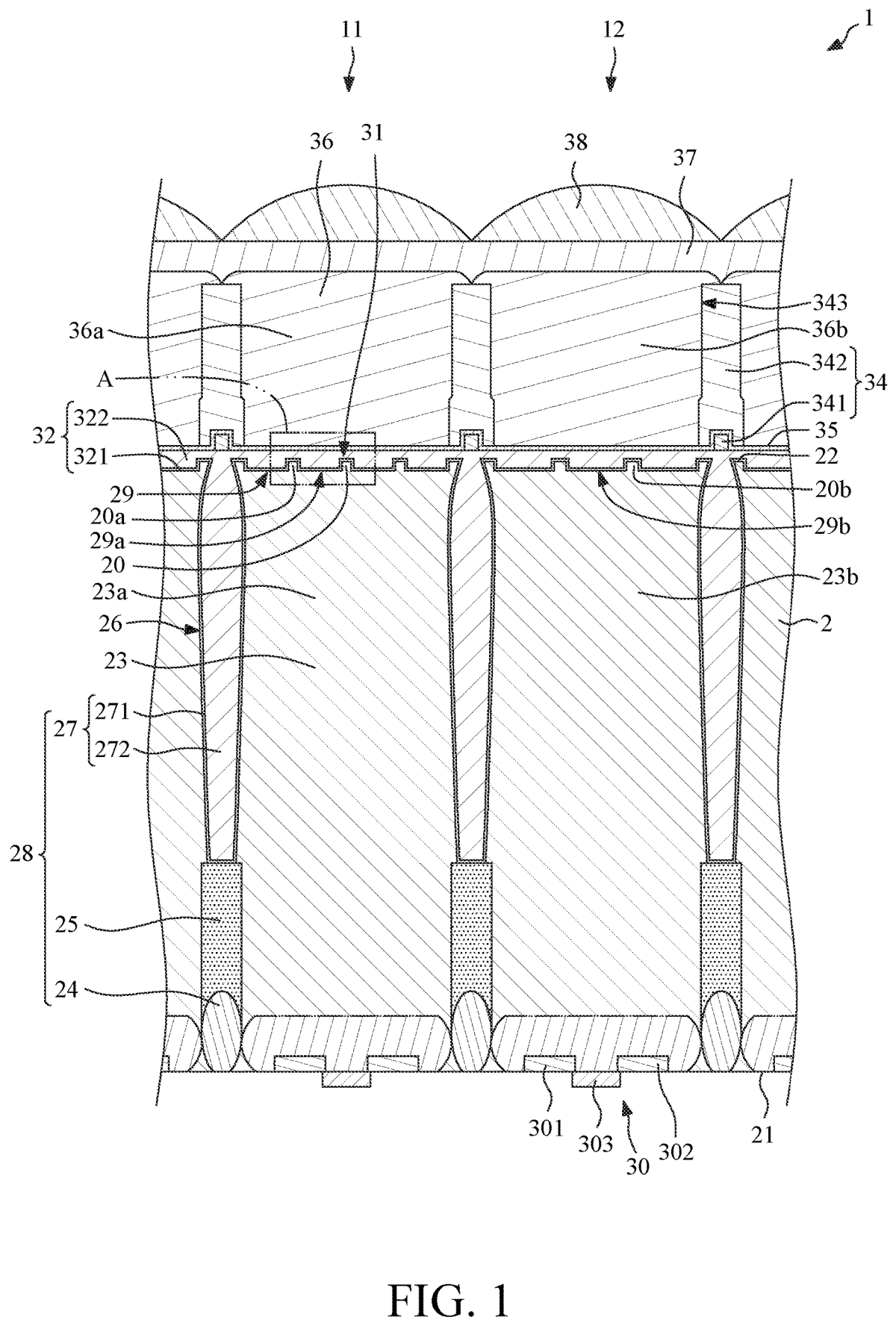

FIG. 1 illustrates a cross-sectional view of an example of a semiconductor image-sensing structure according to some embodiments of the present disclosure.

FIG. 19 illustrates a flow chart of a method of manufacturing a semiconductor image-sensing structure in accordance with some embodiments of the present disclosure.

DETAILED DESCRIPTION OF THE DISCLOSURE

Figure 1A:
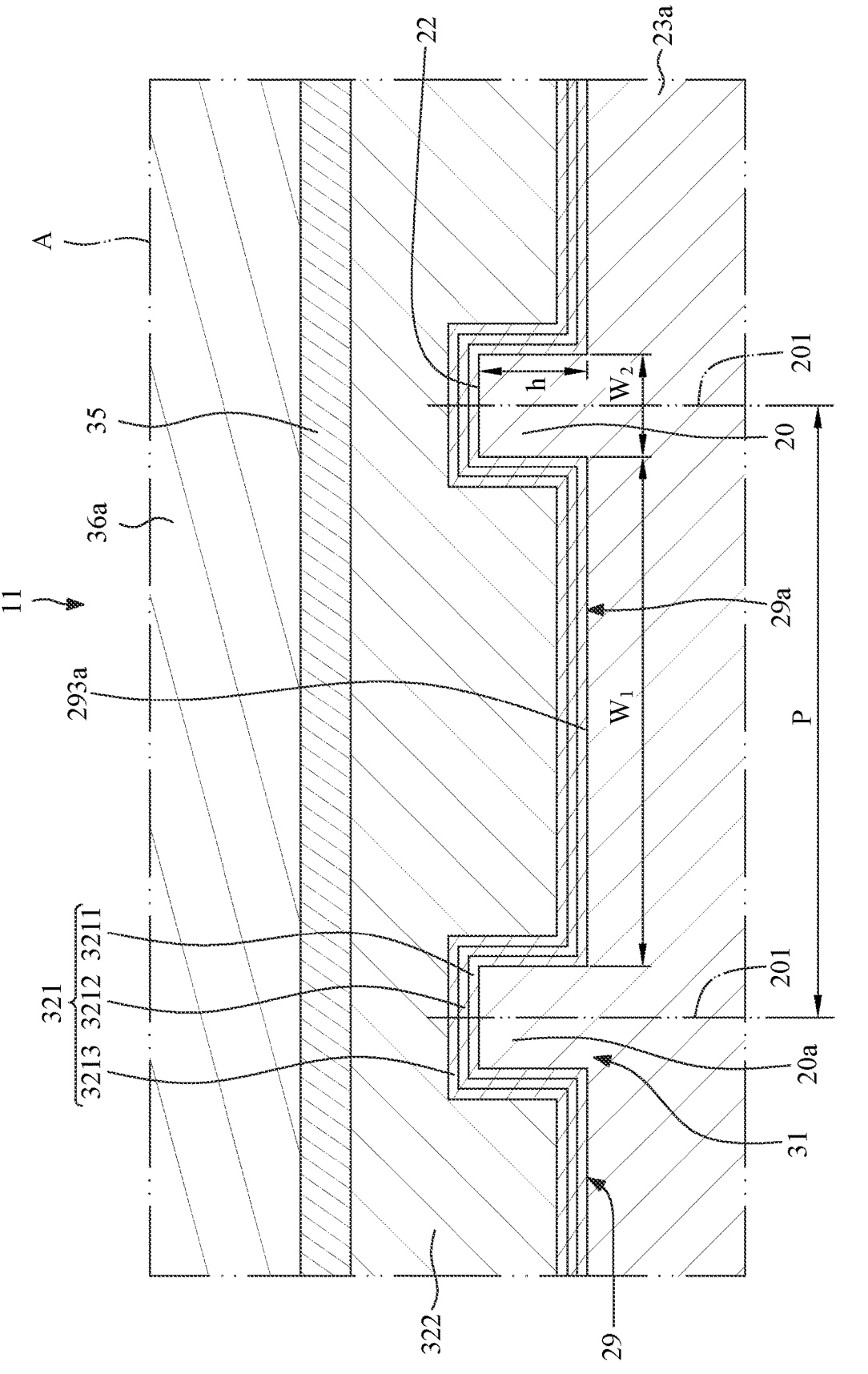
FIG. 1A illustrates an enlarged view of an area "A" of FIG. 1.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

FIG. 1 illustrates a cross-sectional view of an example of a semiconductor image-sensing structure 1 according to some embodiments of the present disclosure. In some embodiments, the semiconductor image-sensing structure 1 may be a Backside illumination (BSI) image sensor. It is noted that BSI image sensors are replacing front-side illumination sensors for their greater efficiency in capturing photons. During a manufacturing process, the BSI image sensors and logic circuits are formed in a semiconductor substrate such as a wafer or silicon chip, followed by formation of an interconnect structure on a front side of the silicon chip.

The semiconductor image-sensing structure 1 may include a substrate 2, at least one transistor 30, an isolation structure 28, an anti-reflection structure 31, a material 32, a protecting layer 35, a grid structure 34, at least one optical element 36, a planarization layer 37 and at least one micro lens 38. The substrate 2 may have a first surface 21 (e.g., a front surface) and a second surface 22 (e.g., a backside surface) opposite to the first surface 21. In some embodiments, the substrate 2 may be a semiconductor substrate, and may be formed of a semiconductor material such as silicon, germanium, diamond or like materials. Compound materials used for semiconductor substrates such as silicon germanium, silicon carbide, gallium arsenide, indium arsenide, indium phosphide, or combinations of these may be used. In alternative embodiments, the substrate 2 may include a silicon on insulator (SOI) substrate.

The substrate 2 may further have at least one photodiode region 23 that is configured to convert light signals (photons) into electrical signals (electrons). In some embodiments, the substrate 2 has a plurality of photodiode regions 23 (including, for example, a first photodiode region 23a and a second photodiode region 23b). In some exemplary embodiments, each of the photodiode regions 23 (including, for example, the first photodiode region 23a and the second photodiode region 23b) may be a photo-sensitive diode that extends from the second surface 22 into the substrate 2.

In addition, the transistor 30 may be disposed under the photodiode region 23, and may be disposed adjacent to the first surface 21 of the substrate 2. The transistor 30 includes a source region 301, drain region 302 and a gate electrode 303 between the source region 301 and the drain region 302. The source region 301 and the drain region 302 are located in the substrate 2 and adjacent to the first surface 21 of the substrate 2. The source region 301 and the drain region 302 may extend from the first surface 21 into the substrate 2. The gate electrode 303 may be disposed on the first surface 21 of the substrate 2. Thus, the gate electrode 303 protrudes from the first surface 21 of the substrate 2. In some embodiments, the gate electrode 303 may include a poly gate, a poly silicide gate, an amorphous gate, an amorphous silicide gate, a vertical transfer gate, a doped poly gate, and any types of high-k metal gate (HKMG).

The isolation structure 28 may be disposed in the substrate 2 and surround the at least one photodiode region 23. The isolation structure 28 may extend from the first surface 21 to the second surface 22 of the substrate 2. Thus, the isolation structure 28 extends through the substrate 2 so as to separate the photodiode regions 23 from each other. The isolation structure 28 may be configured to prevent the light signals (photons) or electrical signals (electrons) of one photodiode region 23 (e.g., the first photodiode region 23a) from entering the adjacent photodiode regions 23 (e.g., the second photodiode region 23b). In some embodiments, the isolation structure 28 includes a plurality of deep trench isolations (DTIs) 27, a plurality of ion implantation regions 25 and a plurality of shallow trench isolations (STIs) 24 connecting to one and another. The deep trench isolation (DTI) 27 connects to the ion implantation region 25, and the ion implantation region 25 connects to the shallow trench isolation (STI) 24. The deep trench isolations (DTIs) 27, the ion implantation regions 25 and the shallow trench isolations (STIs) 24 are aligned with each other. Due to the secure connections between the deep trench isolation (DTI) 27, the ion implantation region 25 and the shallow trench isolation (STI) 24, the photodiode regions 23 are isolated from each other. The shallow trench isolation (STI) 24 is disposed in a trench recessed from the first surface 21 of the substrate 2, thus, extends from the first surface 21 into the substrate 2. The shallow trench isolation (STI) 24 may be disposed around the transistor 30. Further, the ion implantation regions 25 may be disposed between the deep trench isolation (DTI) 27 and the shallow trench isolation (STI) 24. The ion implantation regions 25 may be doped with p-type ions. In addition, the deep trench isolation (DTI) 27 may be disposed in a trench 26 recessed from the second surface 22 of the substrate 2, thus, extends from the second surface 22 into the substrate 2. The deep trench isolation (DTI) 27 may surround the photodiode region 23. The deep trench isolation (DTI) 27 may include a base film 271 and a main portion 272. The base film 271 may be conformal with the sidewall of the trench 26, and defines a central hole. The main portion 272 fills the central hole defined by the base film 271.

The anti-reflection structure 31 may be disposed above or disposed over the photodiode region 23. In some embodiments, the anti-reflection structure 31 cover the photodiode region 23. As shown in FIG. 1, the anti-reflection structure 31 includes a plurality of pillars 20 including, for example, a plurality of first pillars 20a and a plurality of second pillars 20b. A surface of the substrate 2 is patterned to define a plurality of recesses 29 and pillars 20 over the photodiode region 23. Thus, the pillars 20 (first pillars 20a and the pillars 20b) are portions of the substrate 2. The recesses 29 are recessed from the second surface 22 of the substrate 2, and include a plurality of first recesses 29a and a plurality of second recesses 29b. The first recesses 29a are configured to form or define the first pillars 20a, and the second recesses 29b are configured to form or define the second pillars 20b. As shown in FIG. 1A, the first recesses 29a include bottom surfaces 293a which are collectively referred to as or considered as the second surface of the substrate 2. The first pillars 20a protrude from the bottom surfaces 293a (e.g., collectively referred to as the second surface of the substrate 2). After the recesses 29 and the pillars 20 are formed, the bottom surfaces of the recesses 29 (e.g., the bottom surfaces 293a of the first recesses 29a) are portions of the second surface 22 of the substrate 2. That is, the second surface 22 of the substrate 2 is not a flat surface, and may be an uneven surface. The second surface 22 of the substrate 2 may have a sawtooth profile in the cross-sectional view. The pillars 20 which are collectively referred to as parts or all of the anti-reflection structure 31 are configured to reduce a reflection of a light from the at least one optical element 36.

The material 32 may be disposed over the anti-reflection structure 31. The material 32 may cover the pillars 20 (the first pillars 20a and the second pillars 20b) of the anti-reflection structure 31. In some embodiments, the material 32 is used as a planarization layer. The material 32 may include a base film 321 and a main portion 322. The base film 321 is conformal with the pillars 20 (the first pillars 20a and the second pillars 20b) and the recesses 29 (the first recesses 29a and the second recesses 29b). The main portion 322 is disposed on the base film 321. In some embodiments, the deep trench isolation (DTI) 27 may include a portion of the material 32. That is, the material 32 extends into the trench 26 to form the deep trench isolation (DTI) 27. The base film 271 of the deep trench isolation (DTI) 27 and the base film 321 of the material 32 are the same layer and are formed concurrently. There is no interface or gap between the base film 271 of the deep trench isolation (DTI) 27 and the base film 321 of the material 32. Similarly, the main portion 272 of the deep trench isolation (DTI) 27 and the main portion 322 of the material 32 are the same layer and are formed concurrently. There is no interface or gap between the main portion 272 of the deep trench isolation (DTI) 27 and the main portion 322 of the material 32.

The grid structure 34 may be a hybrid low-n grid. The grid structure 34 may be disposed over the material 32 or disposed above the anti-reflection structure 31. The grid structure 34 may align with and overlap the isolation structure 28. The grid structure 34 may include a base grid 341 and a dielectric grid 342. The base grid 341 may be disposed over the isolation structure 28, and is align with and overlap the isolation structure 28. The base grid 341 may be disposed on the material 32. A material of the base grid 341 may include metal, titanium nitride (TiN), tungsten (W) or other suitable material. In addition, the dielectric grid 342 may be disposed over the base grid 341, and is align with and overlap the base grid 341. Thus, the dielectric grid 342 is align with and overlap the isolation structure 28. A material of the dielectric grid 342 may include oxide such as silicon oxide or other suitable material. In some embodiments, a width of the dielectric grid 342 is equal to or greater than the width of the isolation structure 28, but the disclosure is not limited thereto. In some embodiments, a width of a bottom portion of the dielectric grid 342 and a width of a top portion of the dielectric grid 342 are the same. In other embodiments, the width of the bottom portion of the dielectric grid 342 is greater than the width of the top portion of the dielectric grid 342. Thus, the dielectric grid 342 may have a tapered sidewall. The width of the bottom portion of the dielectric grid 342 may be greater than a width of the base grid 341. Thus, the bottom portion of the dielectric grid 342 may surround the base grid 341.

The protecting layer 35 may be formed or disposed over the material 32. In some embodiments, the protecting layer 35 covers and is in contact with the base grid 341 and the material 32. For example, the protecting layer 35 may include aluminum oxide, silicon oxide with different optical property of n and k, and other dielectric films, but the disclosure is not limited thereto. The protecting layer 35 is configured to protect the base grid 341. The dielectric grid 342 may cover and may be in contact with a portion of the protecting layer 35 that covers the base grid 341.

The grid structure 34 defines at least one space 343. The at least one optical element 36 is disposed over the anti-reflection structure 31 and in the at least one space 343 defined by the grid structure 34. Thus, the at least one optical element 36 is disposed over the substrate 2, and the anti-reflection structure 31 (e.g., the pillars 20) is disposed between the at least one photodiode region 23 and the at least one optical element 36. The at least one optical element

36 corresponds to or is aligned with the at least one photodiode region 23. In some embodiments, the at least one optical element 36 includes a first optical element 36a and a second optical element 36b disposed over the anti-reflection structure 31 and surrounded by the grid structure 34. For example, the first optical element 36a is a first color filter 36a disposed on the protecting layer 35, and the second optical element 36b is a second color filter 36b disposed on the protecting layer 35. The first color filter 36a may be aligned with the first photodiode region 23a, and the second color filter 36b may be aligned with the second photodiode region 23b.

In some embodiments, sidewalls of the first color filter 36a and the second color filter 36b are in contact with the grid structure 34 (e.g., the dielectric grid 342), and bottom portions of the first color filter 36a and the second color filter 36b are in contact with the protecting layer 35. Further, top surfaces of the first color filter 36a and the second color filter 36b may be aligned with the top surface of the grid structure 34 (e.g., the dielectric grid 342). Alternatively, the top surfaces of the first color filter 36a and the second color filter 36b may be higher than the top surface of the grid structure 34 (e.g., the dielectric grid 342), thus, portions of the first color filter 36a and the second color filter 36b extend to and cover portions of the top surface of the grid structure 34 (e.g., the dielectric grid 342).

The first color filter 36a and the second color filter 36b may have a refractive index that is less than a refractive index of the grid structure 34. It will be appreciated that due to the different refractive indices between the color filters 36a, 36b and the grid structure 34, when light, such as photons, encounter an interface between the color filters 36a, 36b and the grid structure 34, the light is reflected away from the grid structure 34 and back into the color filters 36a, 36b, such that the light is not directed toward an incorrect photodiode region 23.

Each of the color filters 36a, 36b may allow different specific colors or wavelengths of light to pass there through. For example, one of the color filters 36a, 36b may allow red light, or wavelengths corresponding to red light, to pass there through, while allowing substantially no other colors of light to pass therethrough. One of the color filters 36a, 36b may allow blue light, or wavelengths corresponding to blue light, to pass there through, while allowing substantially no other colors of light to pass therethrough. Or, one of the color filters 36a, 36b may allow green light, or wavelengths corresponding to green light, to pass there through, while allowing substantially no other colors of light to pass therethrough. In some embodiments, other colors of light may be allowed to exclusively pass through the color filters 36a, 36b, but the disclosure is not limited thereto. In some embodiments, the first color filter 36a may be same as or different from the second color filter 36b.

The planarization layer 37 covers the color filters 36a, 36b and the grid structure 34, and a top surface of the planarization layer 37 may be a flat surface. The at least one micro lens 38 may include a plurality of micro lenses 38 disposed over the color filters 36a, 36b. The micro lenses 38 may be disposed on the planarization layer 37. Each of the micro lenses 38 may be aligned with each of the color filters 36a, 36b. The micro lenses 38 are configured to focus light toward the photodiode region 23.

As shown in FIG. 1, the first color filter 36a, the first pillars 20a and the first photodiode region 23a may form a first pixel 11 or a first cell. In some embodiments, a pixel or a cell includes or corresponds to only one photodiode region.

The second color filter 36b, the second pillars 20b and the second photodiode region 23b may form a second pixel 12 or a second cell.

FIG. 1A illustrates an enlarged view of an area "A" of FIG. 1. The base film 321 may include a first layer 3211, a second layer 3212 and a third layer 3213. The first layer 3211 may be disposed over or disposed on the pillars 20, and may include $Al_2O_3$. The first layer 3211 may be further disposed over or disposed on the bottom surfaces of the recesses 29 (e.g., the bottom surfaces 293a of the first recesses 29a). Thus, the first layer 3211 may be conformal with the pillars 20 and the recesses 29. The second layer 3212 may be disposed over or disposed on the first layer 3211, and may include HfO. The third layer 3213 may be disposed over or disposed on the second layer 3212, and may include $Ta_2O_5$. In addition, the main portion 322 may be disposed over or disposed on the third layer 3213, and may include silicon oxide or tungsten.

A pitch P may be defined as a distance between two central axes 201 of two pillars 20. For example, the pitch P is defined as a distance between a central axis 201 of a first pillar 20a and a central axis 201 of another first pillar 20a most adjacent to the first pillar 20a. The pitch P between the pillars 20 may be less than a wavelength of the light from the color filter 36. That is, the pitch P is determined by the wavelength of the light from the color filter 36. As shown in FIG. 1A, in an embodiment that the color filter 36 allows one of red, green and blue light, or wavelengths corresponding to one of red, green and blue light, to pass there through, the pitch P is determined as follows. If the first color filter 36a allows red light, or wavelengths corresponding to red light, to pass there through, the value of the pitch P may be in a range from 540 nm to 610 nm. That is, 540 nm≤P≤610 nm, or 540 nm<P<610 nm. Meanwhile, the first pixel 11 is also referred to as a red pixel. If the first color filter 36a allows green light, or wavelengths corresponding to green light, to pass there through, the value of the pitch P may be in a range from 450 nm to 540 nm. That is, 450 nm≤P≤540 nm, or 450 nm<P<540 nm. Meanwhile, the first pixel 11 is also referred to as a green pixel. If the first color filter 36a allows blue light, or wavelengths corresponding to blue light, to pass there through, the value of the pitch P may be less than 450 nm. That is, P≤450 nm, or P<450 nm. Meanwhile, the first pixel 11 is also referred to as a blue pixel.

In another embodiment that the color filter 36 allows one of red, yellow and blue light, or wavelengths corresponding to one of red, yellow and blue light, to pass there through, the pitch P is determined as follows. If the first color filter 36a allows red light, or wavelengths corresponding to red light, to pass there through, the value of the pitch P may be in a range from 570 nm to 610 nm. That is, 570 nm≤P≤610 nm, or 570 nm<P<610 nm. Meanwhile, the first pixel 11 is also referred to as a red pixel. If the first color filter 36a allows yellow light, or wavelengths corresponding to yellow light, to pass there through, the value of the pitch P may be in a range from 450 nm to 570 nm. That is, 450 nm≤P≤570 nm, or 450 nm<P<570 nm. Meanwhile, the first pixel 11 is also referred to as a yellow pixel. If the first color filter 36a allows blue light, or wavelengths corresponding to blue light, to pass there through, the value of the pitch P may be less than 450 nm. That is, P≤450 nm, or P<450 nm. Meanwhile, the first pixel 11 is also referred to as a blue pixel.

The bottom surface 293a of the first recess 29a has a width $W_1$. The first pillar 20a has a width $W_2$ and a height h. The width $W_1$ may be three times, four times, five times, six times the width $W_2$. A ratio of height h to the pitch P may be 1:2 to 1:10. In some embodiments, the width $W_2$ may be 5 nm to 100 nm, or 5 nm to 20 nm, or 20 nm to 100 nm. A shape of a cross section of each of the first pillars 20a may be square or rectangle.

Referring to FIG. 1, a number of the first pillars 20a under the first optical element 36a of the first pixel 11 may be same as or different from a number of the second pillars 20b under the second optical element 36b of the second pixel 12. Further, the pitch P between the first pillars 20a under the first optical element 36a of the first pixel 11 may be same as or different from a pitch between the second pillars 20b under the second optical element 36b of the second pixel 12. The width $W_2$ of each of the first pillars 20a may be same as or different from a width of each of the second pillars 20b. In addition, the width $W_1$ of the bottom surface 293a of the first recess 29a under the first optical element 36a of the first pixel 11 may be same as or different from a width of the bottom surface of the second recess 29b under the second optical element 36b of the second pixel 11.

In the embodiment illustrated in FIG. 1 and FIG. 1A, the anti-reflection structure 31 (e.g., the pillars 20) reduces a reflection of a light from the at least one optical element 36, and reduces an optical cross-talk between two pixels. Thus, a performance of the semiconductor image-sensing structure 1 is improved. For example, a quantum efficiency (QE) of the semiconductor image-sensing structure 1 is increased more than 2%, or 2.8%, or 3%.

Figure 1B:
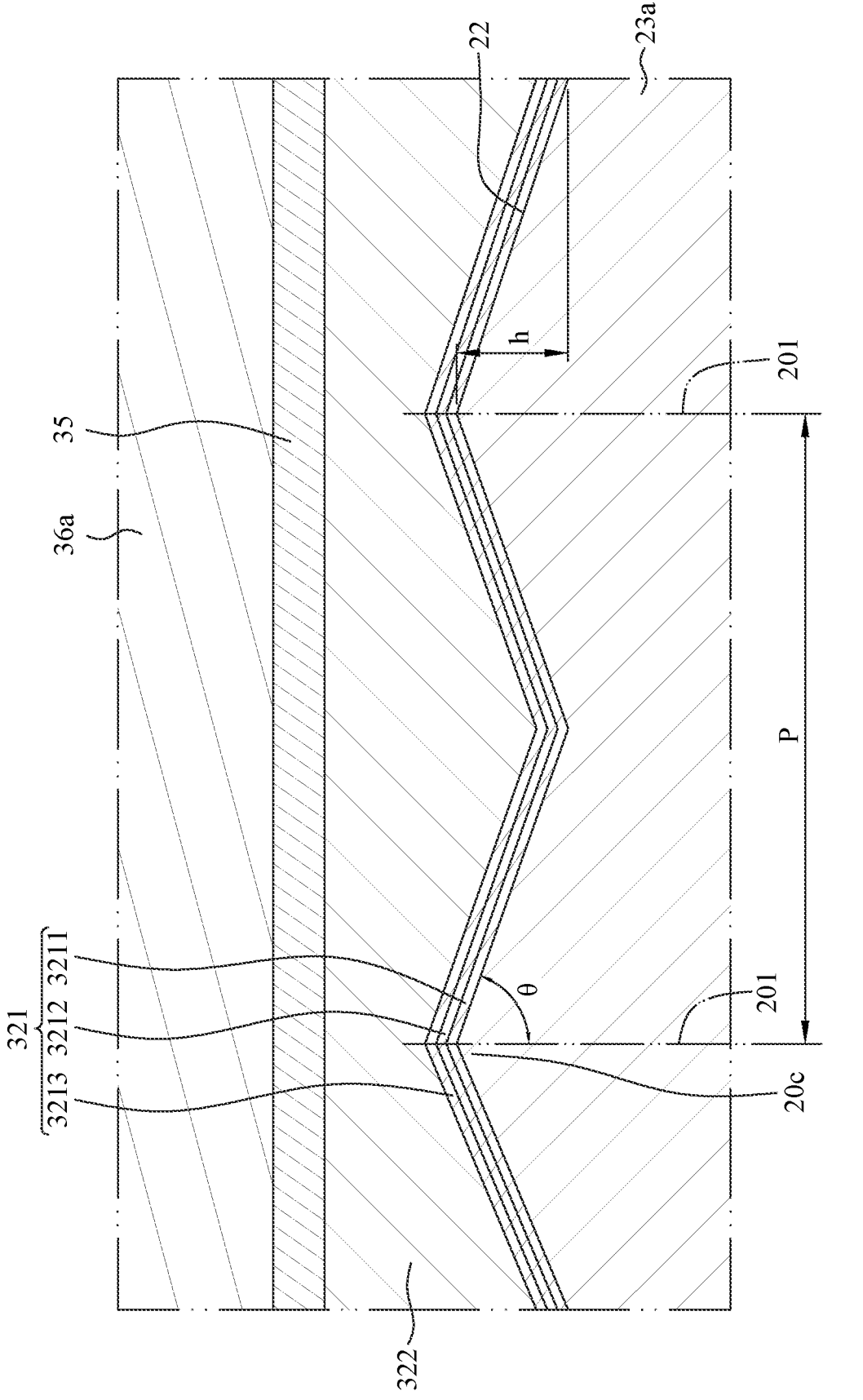
FIG. 1B illustrates an enlarged view of an area an example of a semiconductor image-sensing structure according to some embodiments of the present disclosure.

FIG. 1B illustrates an enlarged view of an area an example of a semiconductor image-sensing structure according to some embodiments of the present disclosure. The structure of FIG. 1B is similar to the structure of FIG. 1A, except for the shape of the pillars 20c. As shown in FIG. 1B, a shape of a cross section of each of the pillars 20c may be triangle. The pitch P may be defined as a distance between two peaks of two pillars 20c. In addition, an inclination angle θ between the central axis 201 and the second surface 22 of the substrate 2 may be less than 70 degrees. For example, the inclination angle θ may be 30 degrees to 70 degrees, or 45 degrees to 70 degrees, or 50 degrees to 70 degrees.

Figure 1C:
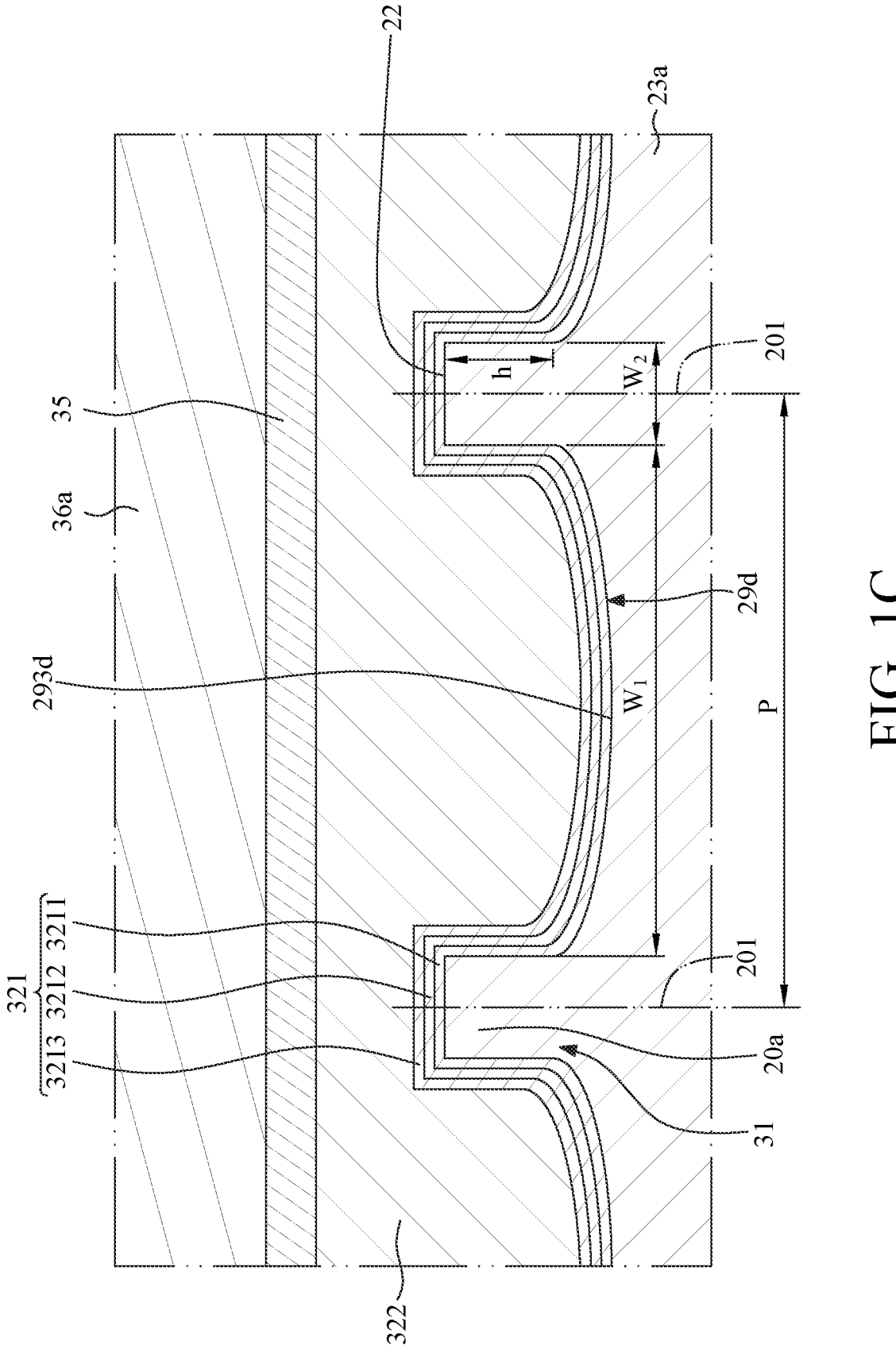
FIG. 1C illustrates an enlarged view of an area an example of a semiconductor image-sensing structure according to some embodiments of the present disclosure.

FIG. 1C illustrates an enlarged view of an area an example of a semiconductor image-sensing structure according to some embodiments of the present disclosure. The structure of FIG. 1C is similar to the structure of FIG. 1A, except for the shape of the bottom surface 293d of the recess 29d. As shown in FIG. 1C, the bottom surface 293d of the recess 29d is a curved surface, a concave surface or a rounded surface.

Figure 1D:
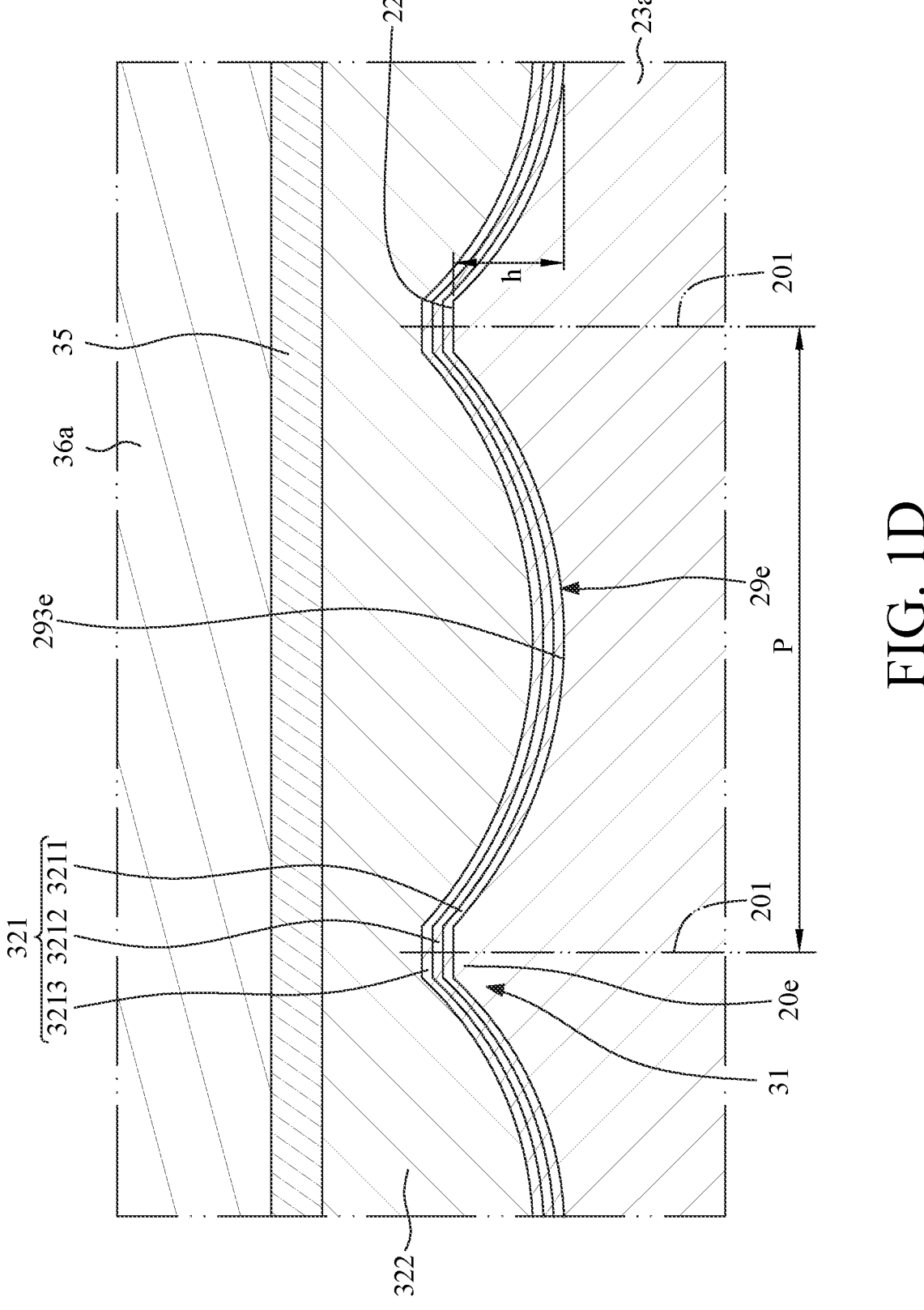
FIG. 1D illustrates an enlarged view of an area an example of a semiconductor image-sensing structure according to some embodiments of the present disclosure.

FIG. 1D illustrates an enlarged view of an area an example of a semiconductor image-sensing structure according to some embodiments of the present disclosure. The structure of FIG. 1D is similar to the structure of FIG. 1A, except for the shape of the pillar 20e and the shape of the bottom surface 293e of the recess 29e. As shown in FIG. 1D, the lateral surface of the pillar 20e and the bottom surface 293e of the recess 29e form a curved surface, a concave surface or a rounded surface.

Figure 2:
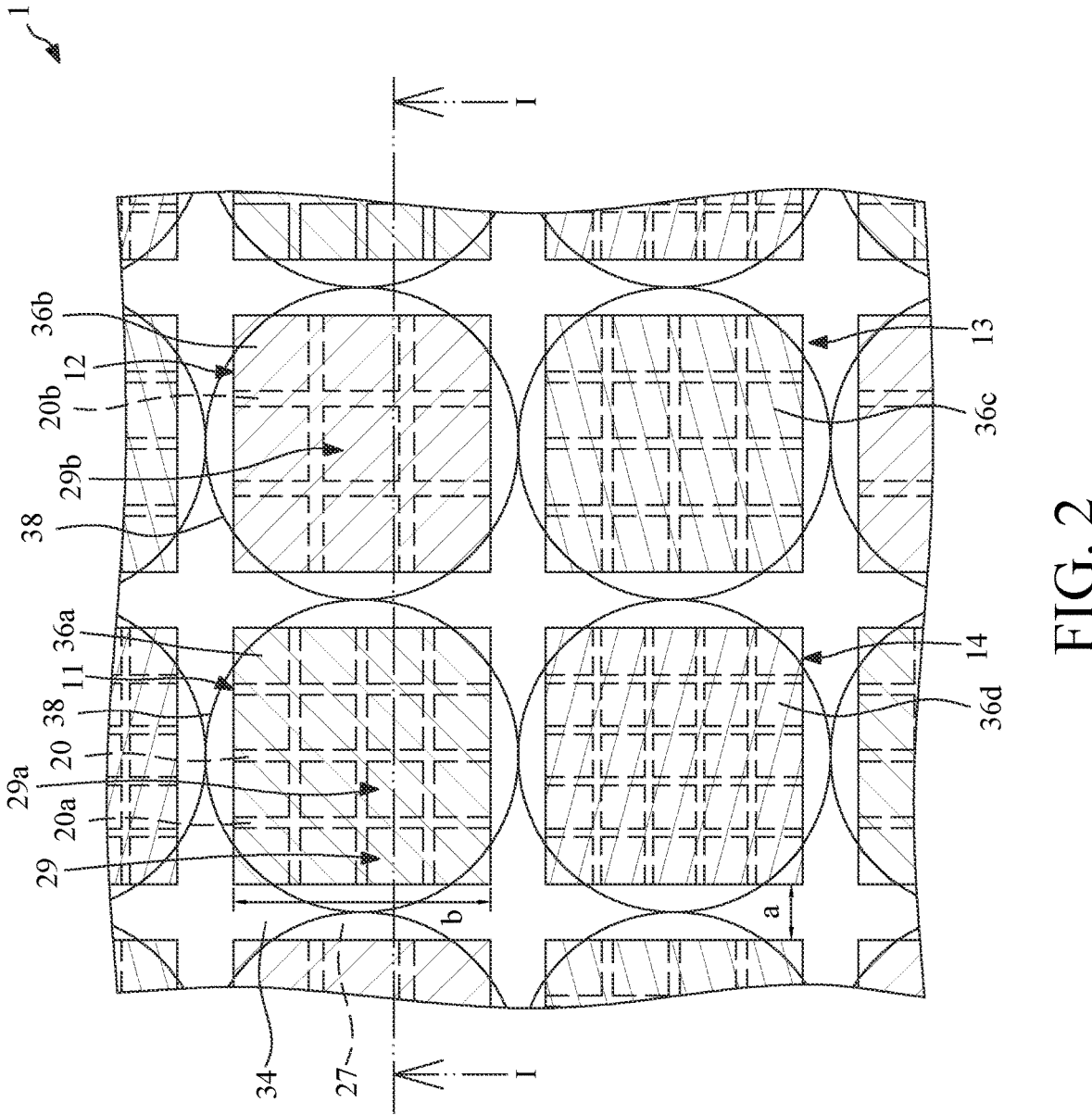
FIG. 2 illustrates a top view of an example of the semiconductor image-sensing structure of FIG. 1.

FIG. 2 illustrates a top view of an example of the semiconductor image-sensing structure 1 of FIG. 1. It is noted that FIG. 1 is a cross-sectional view taken along line I-I of FIG. 2. As shown in FIG. 2, the first color filter 36a of the first pixel 11 may allow green light, or wavelengths corresponding to green light, to pass there through. Thus, the first pixel 11 is a green pixel. The first recesses 29a under the first color filter 36a of the first pixel 11 may form a 4×4 array. The second color filter 36b of the second pixel 12 may allow red light, or wavelengths corresponding to red light, to pass there through. Thus, the second pixel 12 is a red pixel. The second recesses 29b under the second color filter 36b of the second pixel 12 may form a 3×3 array. The color filter 36*c* of the third pixel 13 may allow green light, or wavelengths corresponding to green light, to pass there through. Thus, the third pixel 13 is a green pixel. The recesses under the color filter 36*c* of the third pixel 13 may form a 4×4 array. The color filter 36*d* of the fourth pixel 14 may allow blue light, or wavelengths corresponding to blue light, to pass there through. Thus, the fourth pixel 14 is a blue pixel. The recesses under the color filter 36*d* of the fourth pixel 14 may form a 5×5 array.

In some embodiments, the color filter 36*a* of the first pixel 11 and the color filter 36*c* of the third pixel 13 may allow yellow light, or wavelengths corresponding to yellow light, to pass there through. Thus, each of the first pixel 11 and the third pixel 13 is a yellow pixel.

Figure 3:
FIG. 3 illustrates a top view of an example of a semiconductor image-sensing structure according to some embodiments of the present disclosure.
Figure 3:
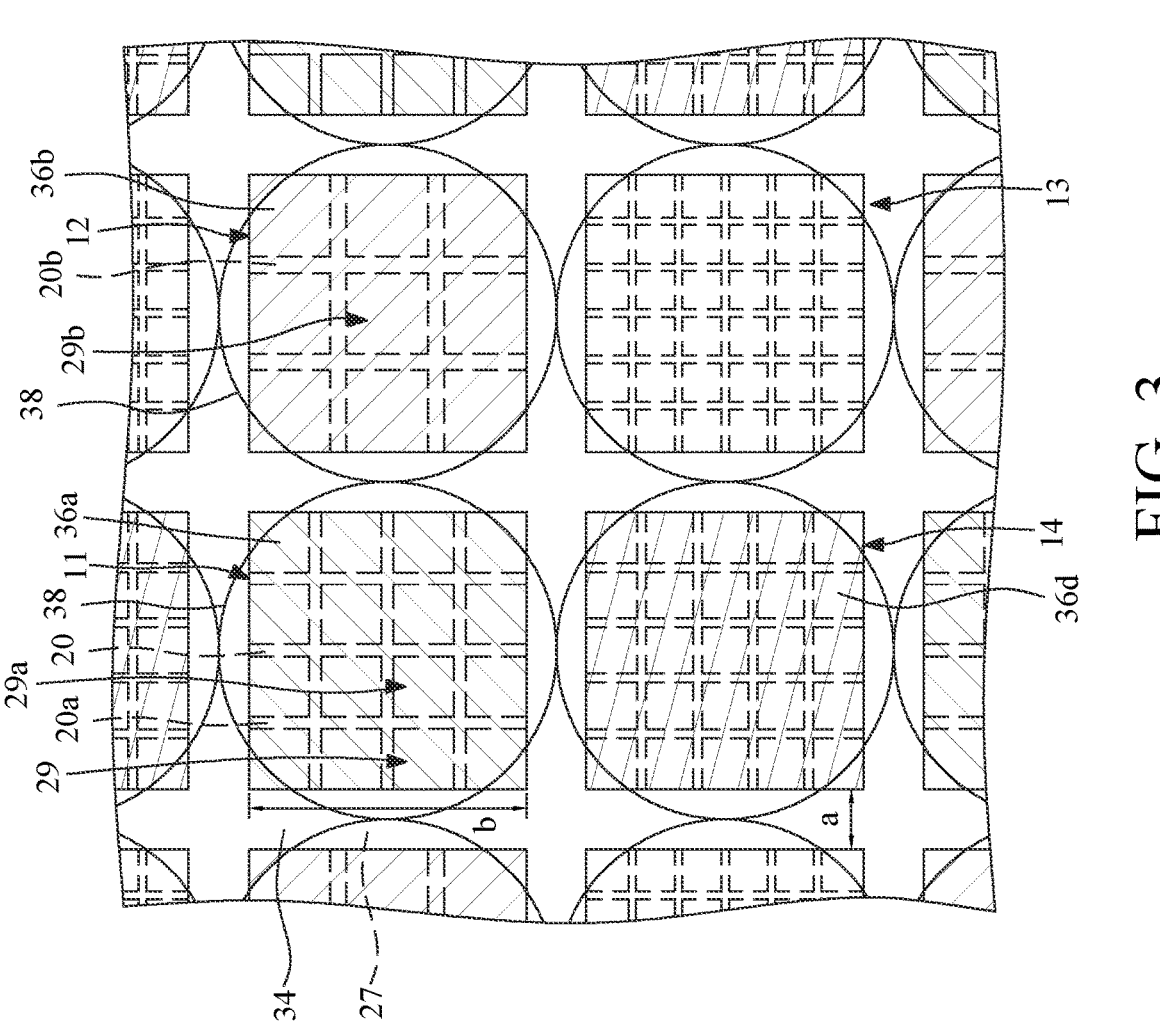

FIG. 3 illustrates a top view of an example of a semiconductor image-sensing structure 1*a* according to some embodiments of the present disclosure. The semiconductor image-sensing structure 1*a* of FIG. 3 is similar to the semiconductor image-sensing structure 1 of FIG. 2, except that the third pixel 13 does not include color filter. In addition, the recesses of the third pixel 13 may form a 6×6 array. A pitch between the pillars in the third pixel 13 may be less than 400 nm.

Figure 4:
FIG. 4 illustrates a top view of an example of the semiconductor image-sensing structure of FIG. 1.
Figure 4:
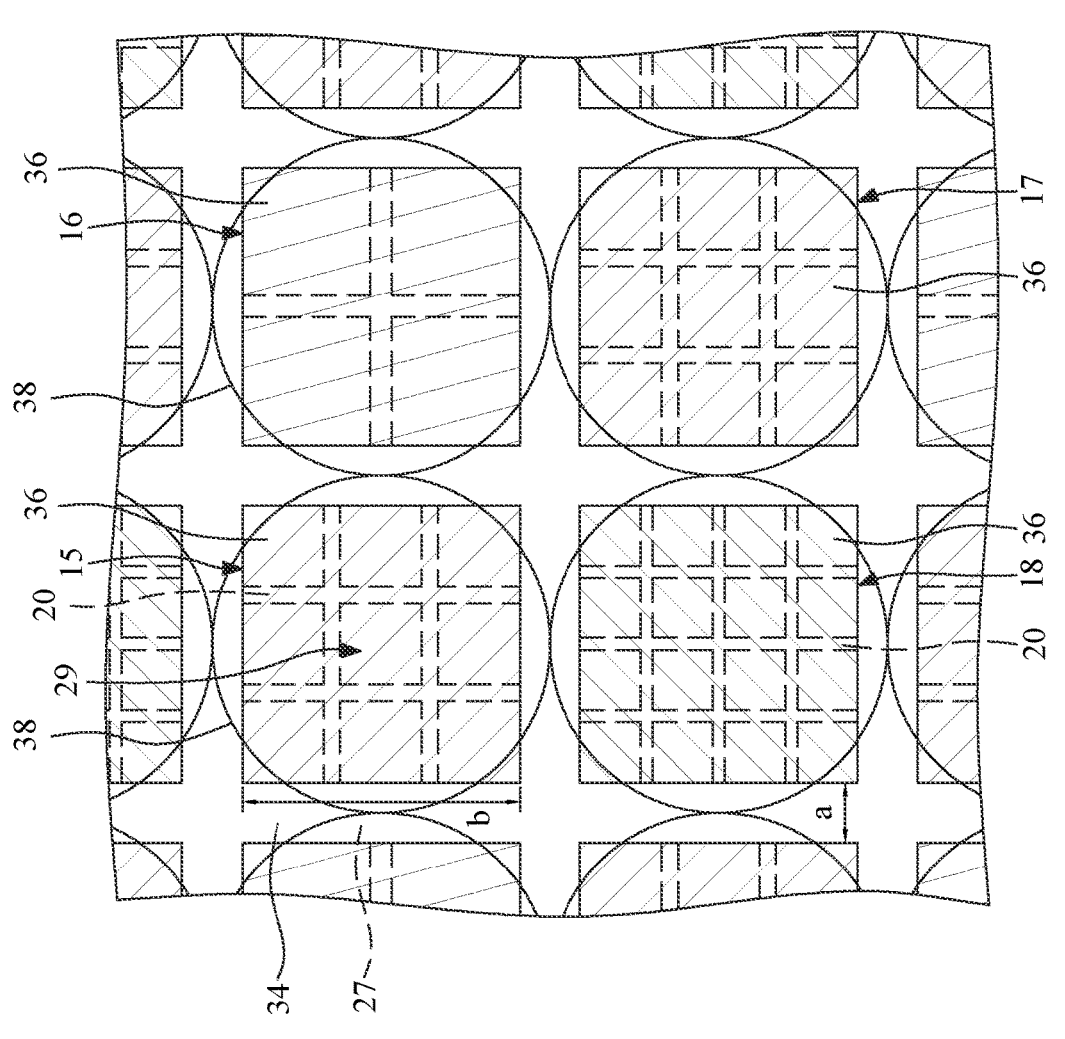

FIG. 4 illustrates a top view of an example of the semiconductor image-sensing structure 1*b* of FIG. 1. The semiconductor image-sensing structure 1*b* of FIG. 4 is similar to the semiconductor image-sensing structure 1 of FIG. 2, and the differences are described as follows. As shown in FIG. 4, the color filter 36 of the first pixel 15 may allow green light, or wavelengths corresponding to green light, to pass there through. Thus, the first pixel 15 is a green pixel. The recesses 29 under the color filter 36 of the first pixel 15 may form a 3×3 array. A width "b" of the first pixel 15 may be 1500 nm to 2500 nm. A width "a" of the grid structure 34 may be 80 nm to 200 nm, or 80 nm to 100 nm, or 100 nm to 200 nm.

The color filter 36 of the second pixel 16 may allow red light, or wavelengths corresponding to red light, to pass there through. Thus, the second pixel 16 is a red pixel. The recesses 29 under the color filter 36 of the second pixel 16 may form a 2×2 array. The color filter 36 of the third pixel 17 may allow green light, or wavelengths corresponding to green light, to pass there through. Thus, the third pixel 17 is a green pixel. The recesses under the color filter 36 of the third pixel 17 may form a 3×3 array. The color filter 36 of the fourth pixel 18 may allow blue light, or wavelengths corresponding to blue light, to pass there through. Thus, the fourth pixel 18 is a blue pixel. The recesses under the color filter 36 of the fourth pixel 18 may form a 4×4 array.

In some embodiments, the color filter 36 of the first pixel 15 and the color filter 36 of the third pixel 17 may allow yellow light, or wavelengths corresponding to yellow light, to pass there through. Thus, each of the first pixel 15 and the third pixel 17 is a yellow pixel.

Figure 5:
FIG. 5 illustrates a top view of an example of a semiconductor image-sensing structure according to some embodiments of the present disclosure.
Figure 5:
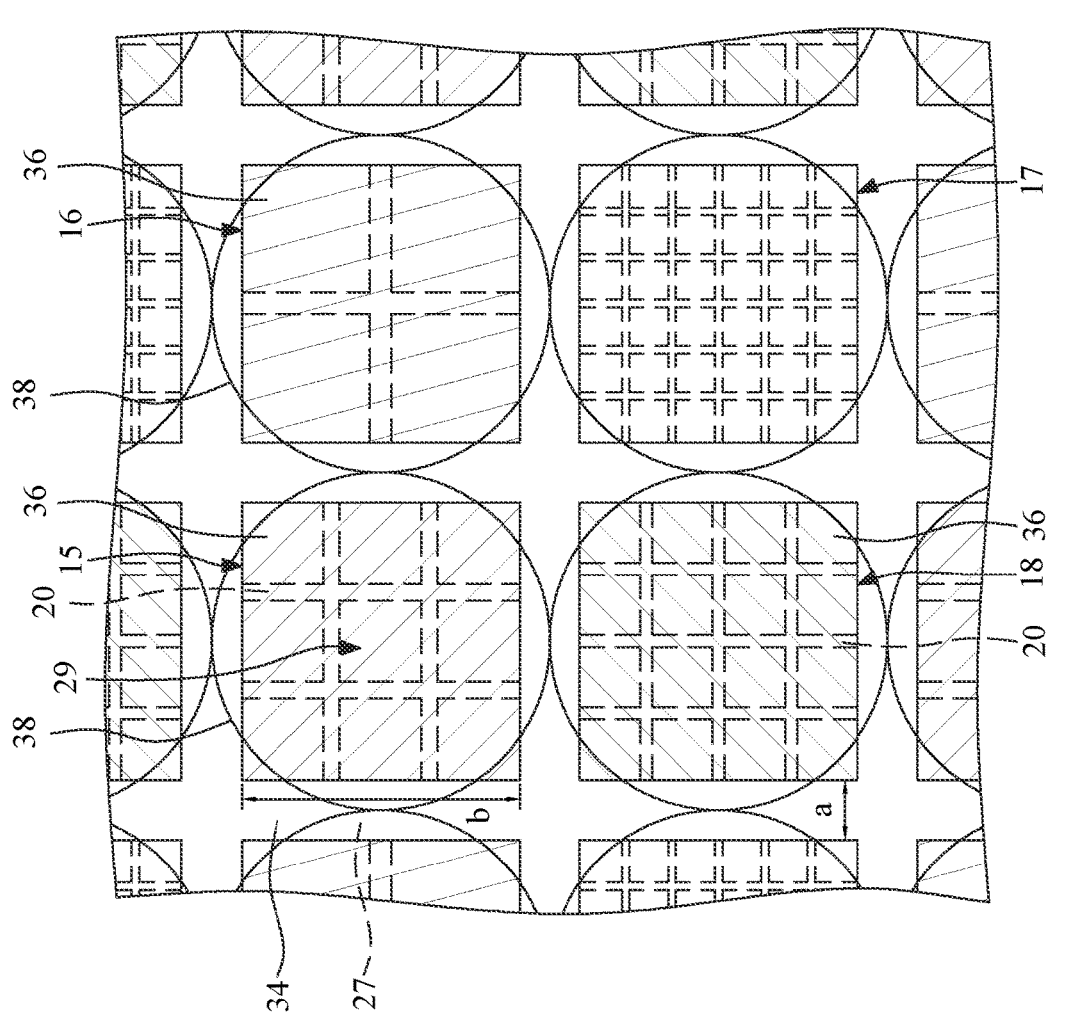

FIG. 5 illustrates a top view of an example of a semiconductor image-sensing structure 1*c* according to some embodiments of the present disclosure. The semiconductor image-sensing structure 1*c* of FIG. 5 is similar to the semiconductor image-sensing structure 1*b* of FIG. 4, except that the third pixel 17 does not include color filter. In addition, the recesses of the third pixel 17 may form a 6×6 array. A pitch between the pillars in the third pixel 17 may be less than 400 nm.

Figure 6:
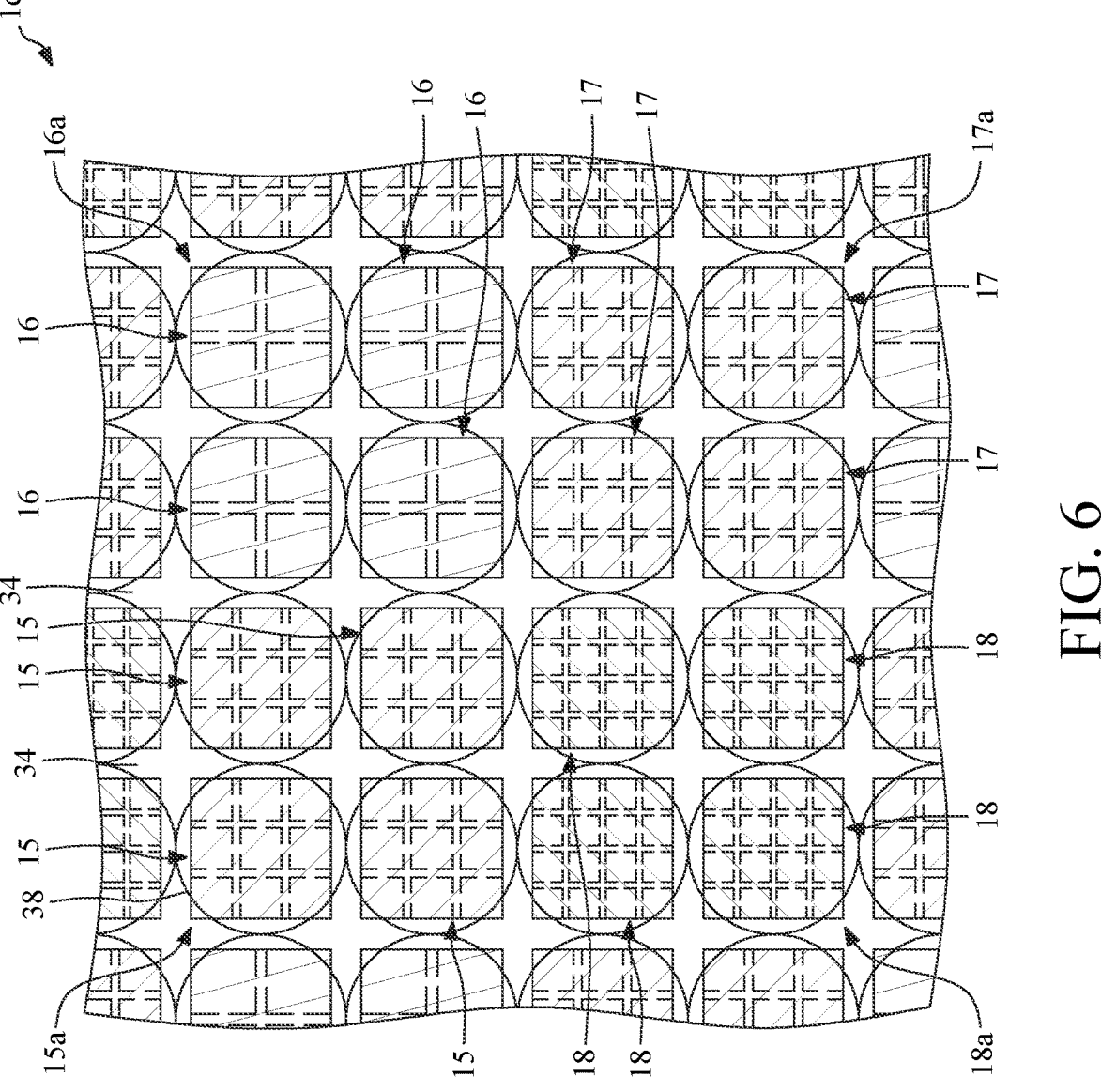
FIG. 6 illustrates a top view of an example of a semiconductor image-sensing structure according to some embodiments of the present disclosure.

FIG. 6 illustrates a top view of an example of a semiconductor image-sensing structure 1*d* according to some embodiments of the present disclosure. The semiconductor image-sensing structure 1*d* of FIG. 6 is similar to the semiconductor image-sensing structure 1*b* of FIG. 4, except that four pixels having the same color of color filter are arranged in an array of two rows by two columns to form a group. For example, four first pixels 15 (e.g., four green pixels) are arranged in an array of two rows by two columns to form a first group 15*a*, four second pixels 16 (e.g., four red pixels) are arranged in an array of two rows by two columns to form a second group 16*a*, four third pixels 17 (e.g., four green pixels) are arranged in an array of two rows by two columns to form a third group 17*a*, and four fourth pixels 18 (e.g., four blue pixels) are arranged in an array of two rows by two columns to form a fourth group 18*a*. Further, the first group 15*a*, the second group 16*a*, the third group 17*a* and the fourth group 18*a* form a 2×2 array.

Figure 7:
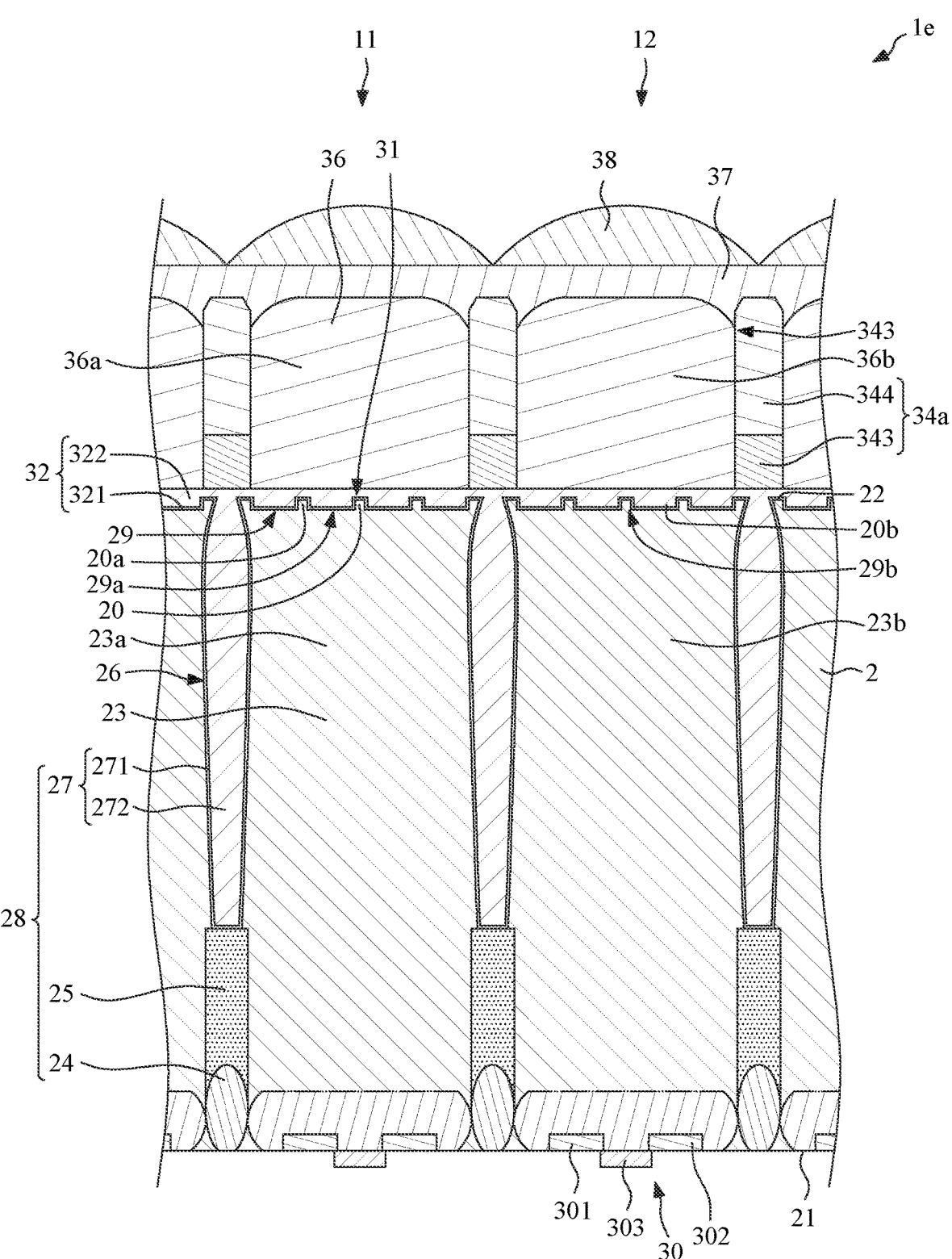
FIG. 7 illustrates a cross-sectional view of an example of a semiconductor image-sensing structure according to some embodiments of the present disclosure.

FIG. 7 illustrates a cross-sectional view of an example of a semiconductor image-sensing structure 1*e* according to some embodiments of the present disclosure. The semiconductor image-sensing structure 1*e* of FIG. 7 is similar to the semiconductor image-sensing structure 1 of FIG. 1, except for a structure of the grid structure 34*a*. The grid structure 34*a* of FIG. 7 includes a lower portion 343 and an upper portion 344. The material of the lower portion 343 may be same as the material of the material of the base grid 341 of FIG. 1. The material of the upper portion 344 may be same as the material of the main portion 322 of the material 32. A width of the lower portion 343 may be equal to a width of the upper portion 344. Thus, a lateral surface of the lower portion 343 may be aligned with a lateral surface of the upper portion 344. The optical element 36 may contact the lateral surface of the lower portion 343 and the lateral surface of the upper portion 344. In addition, a top surface of the optical element 36 may be aligned with or leveled with a top surface of the grid structure 34*a* (a top surface of the upper portion 344).

Figure 8:
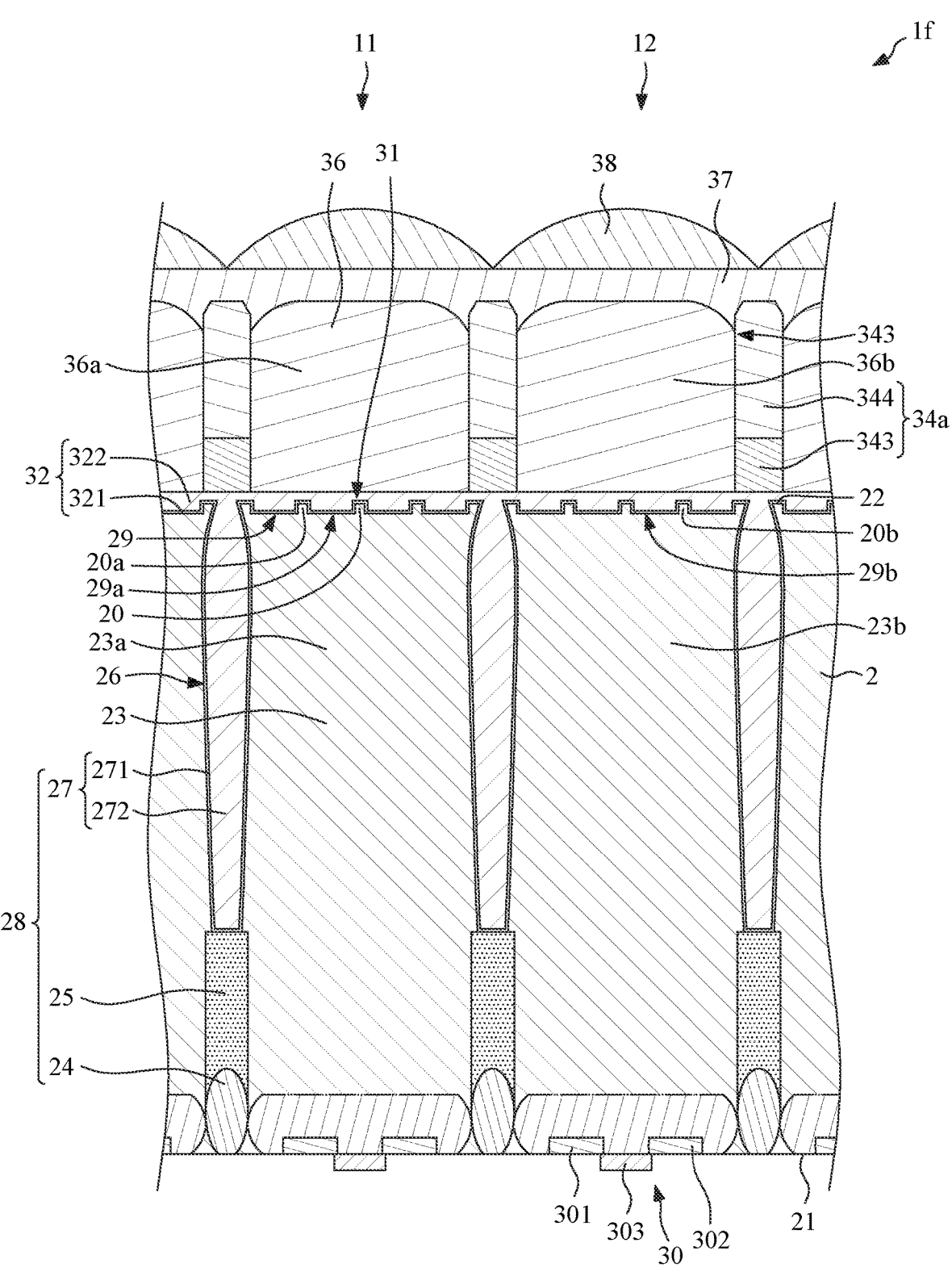
FIG. 8 illustrates a cross-sectional view of an example of a semiconductor image-sensing structure according to some embodiments of the present disclosure.

FIG. 8 illustrates a cross-sectional view of an example of a semiconductor image-sensing structure if according to some embodiments of the present disclosure. The semiconductor image-sensing structure if of FIG. 8 is similar to the semiconductor image-sensing structure 1*e* of FIG. 7, except for structures of the second pillars 20*b* and the second recesses 29*b*. In FIG. 8, a size of each of the second pillars 20*b* may be equal to a size of each of the first pillars 20*a*, and a size of each of the second recesses 29*b* may be equal to a size of each of the first recesses 29*a*. The second optical element 36*b* may be same as the first optical element 36*a*.

Figure 9:
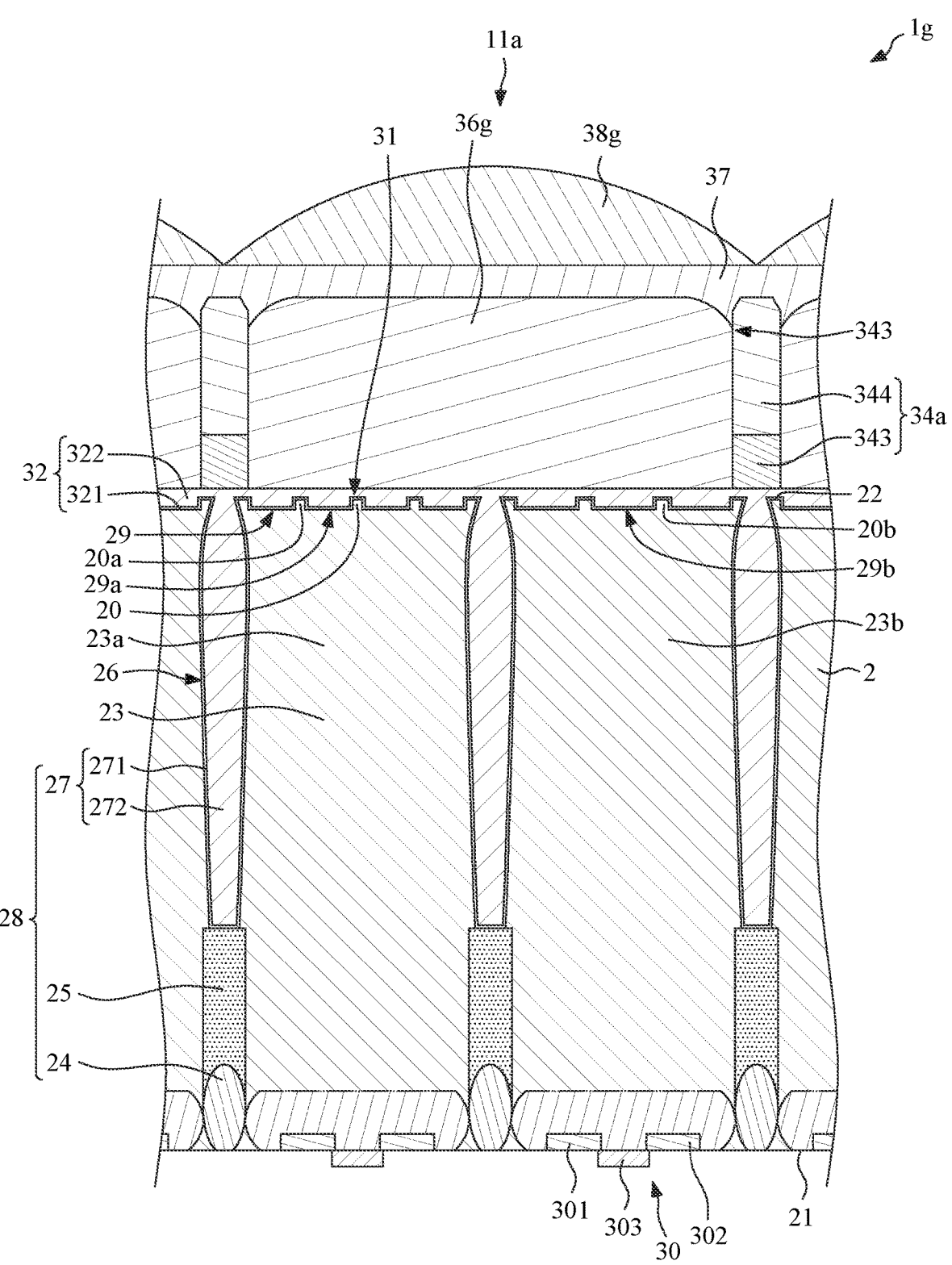
FIG. 9 illustrates a cross-sectional view of an example of a semiconductor image-sensing structure according to some embodiments of the present disclosure.

FIG. 9 illustrates a cross-sectional view of an example of a semiconductor image-sensing structure 1*g* according to some embodiments of the present disclosure. The semiconductor image-sensing structure 1*g* of FIG. 9 is similar to the semiconductor image-sensing structure 1*e* of FIG. 7, and the differences are described as follows. As shown in FIG. 9, the space 343 defined by the grid structure 34*a* may be enlarged to cover a plurality of photodiode regions 23 (e.g., two photodiode regions 23*a*, 23*b*, or four photodiode regions). Further, the optical element 36*g* disposed in the space 343 may be also enlarged to cover a plurality of photodiode regions 23 (e.g., two photodiode regions 23*a*, 23*b*, or four photodiode regions). The micro lens 38*g* disposed on the optical element 36*g* may be also enlarged to cover a plurality of photodiode regions 23 (e.g., two photodiode regions 23*a*, 23*b*, or four photodiode regions). The optical element 36*g* (e.g., the color filter 36), the first pillars 20*a*, the second pillars 20*b*, the first photodiode region 23*a*, the second photodiode region 23*b* may form a first group 11*a*.

Figure 10:
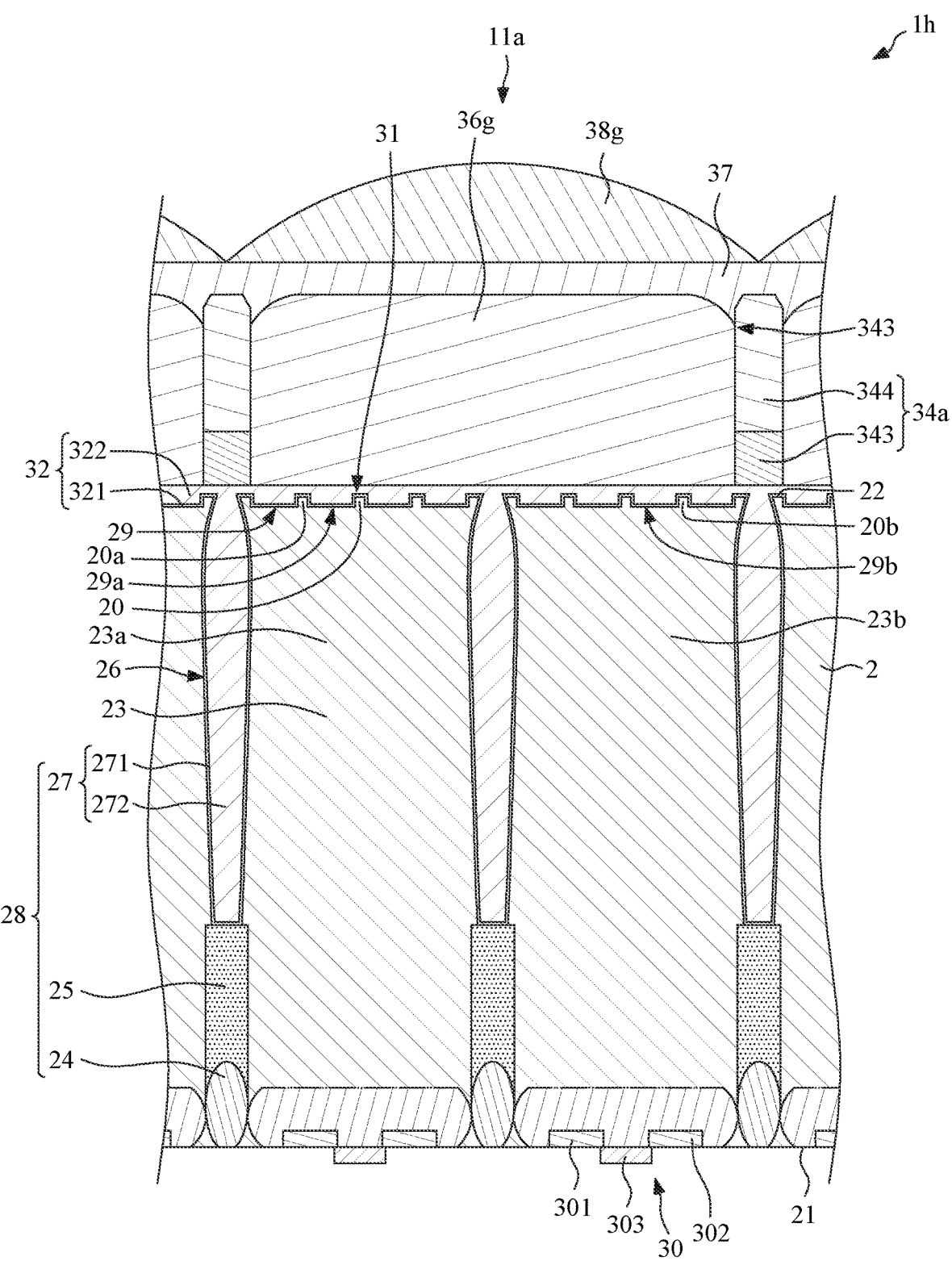
FIG. 10 illustrates a cross-sectional view of an example of a semiconductor image-sensing structure according to some embodiments of the present disclosure.

FIG. 10 illustrates a cross-sectional view of an example of a semiconductor image-sensing structure 1*h* according to some embodiments of the present disclosure. The semiconductor image-sensing structure 1*h* of FIG. 10 is similar to the semiconductor image-sensing structure 1*g* of FIG. 9, except for structures of the second pillars 20*b* and the second recesses 29*b*. In FIG. 10, a size of each of the second pillars 20*b* may be equal to a size of each of the first pillars 20*a*, and a size of each of the second recesses 29*b* may be equal to a size of each of the first recesses 29*a*. A property of the first photodiode region 23*a* may be same as the property of the second photodiode region 23*b*.

Figure 11:
FIG. 11 illustrates a top view of an example of the semiconductor image-sensing structure of FIG. 10.

FIG. 11 illustrates a top view of an example of the semiconductor image-sensing structure 1*h* of FIG. 10. As shown in FIG. 11, the color filter 36*g* of the first group 11*a* may allow green light, or wavelengths corresponding to green light, to pass there through. Thus, the first group 11*a* is a green group. The first group 11*a* may include four pixels. Thus, the optical element 36*g* and the micro lens 38*g* of the first group 11*a* may cover four photodiode regions 23. The color filter 36*h* of a second group 12*a* may allow red light, or wavelengths corresponding to red light, to pass there through. Thus, the second group 12*a* is a red group. The color filter 36*i* of a third group 13*a* may allow green light, or wavelengths corresponding to green light, to pass there through. Thus, the third group 13*a* is a green group. The color filter 36*j* of a fourth group 14*a* may allow blue light, or wavelengths corresponding to blue light, to pass there through. Thus, the fourth group 14*a* is a blue group. In some embodiments, the color filter 36*g* of the first group 11*a* and the color filter 36*i* of the third group 13*a* may allow yellow light, or wavelengths corresponding to yellow light, to pass there through. Thus, each of the first group 11*a* and the third group 13*a* is a yellow group.

Figure 12:
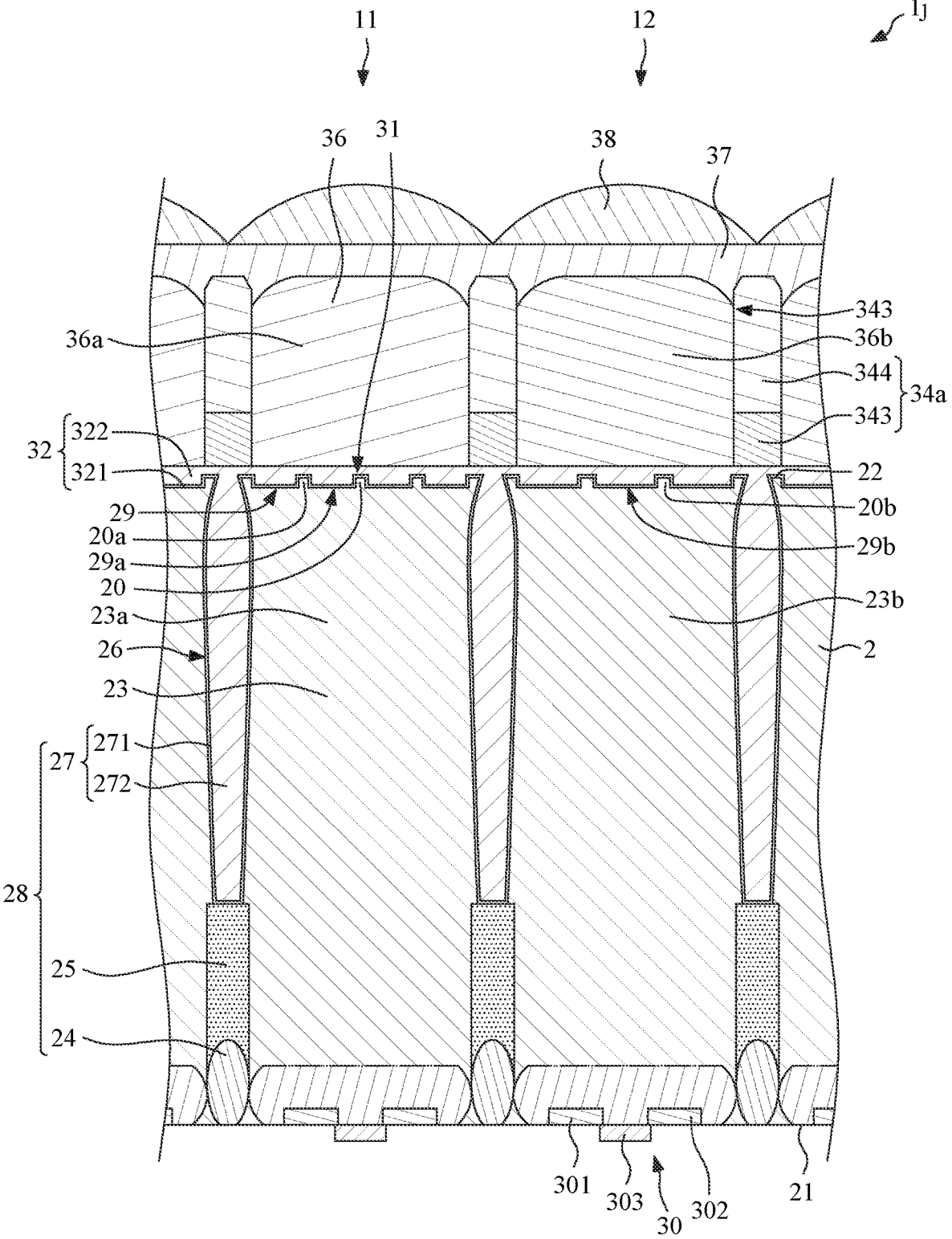
FIG. 12 illustrates a cross-sectional view of an example of a semiconductor image-sensing structure according to some embodiments of the present disclosure.

FIG. 12 illustrates a cross-sectional view of an example of a semiconductor image-sensing structure 1*j* according to some embodiments of the present disclosure. The semiconductor image-sensing structure 1*j* of FIG. 12 is similar to the semiconductor image-sensing structure 1*e* of FIG. 7, except that the second optical element 36*b* (e.g., the second color filter 36*b*) is different from the first optical element 36*a* (e.g., the first color filter 36*a*).

FIG. 13 through FIG. 18 illustrate a method for manufacturing a semiconductor image-sensing structure according to some embodiments of the present disclosure. In some embodiments, the method is for manufacturing the semiconductor image-sensing structure 1 shown in FIG. 1.

Figure 13:
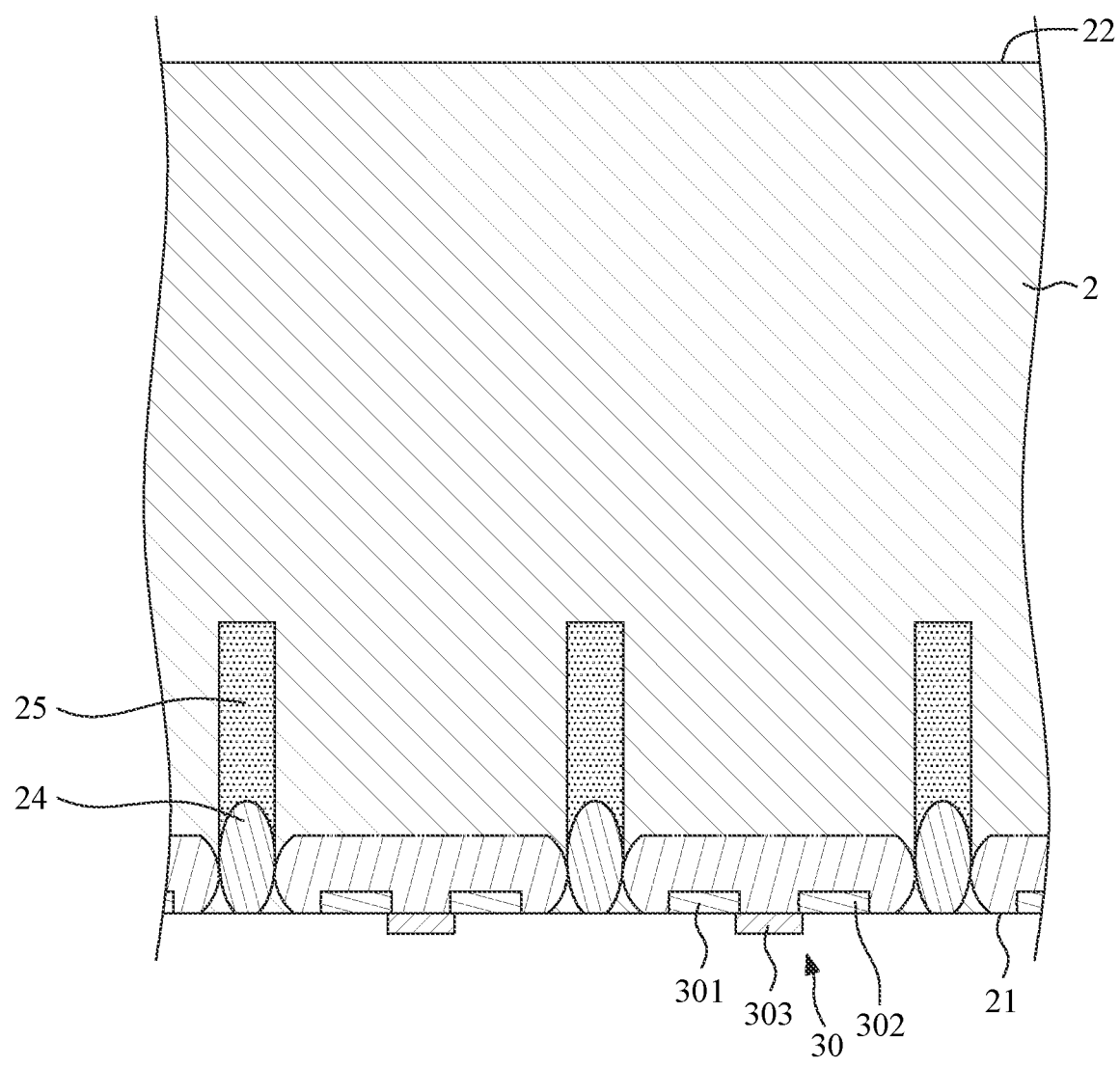
FIG. 13, FIG. 14, FIG. 15, FIG. 16, FIG. 17 and FIG. 18 illustrate various stages in the manufacture of a semiconductor image-sensing structure, in accordance with some embodiments of the present disclosure.

Referring to FIG. 13, a substrate 2 is provided. The substrate 2 can be, for example, silicon substrate. The substrate 2 has a first surface 21 (e.g., a front surface) and a second surface 22 (e.g., a backside surface) opposite to the first surface 21. The substrate 2 further has at least one photodiode region 23. In some embodiments, the substrate 2 has a plurality of photodiode regions 23 (including, for example, a first photodiode region 23*a* and a second photodiode region 23*b*). In addition, at least one transistor 30 is formed in the substrate 2. The transistor 30 may be disposed under the photodiode region 23, and may be disposed adjacent to the first surface 21 of the substrate 2. In addition, a plurality of ion implantation regions 25 and a plurality of shallow trench isolations (STIs) 24 may be formed in the substrate 2, and may be disposed adjacent to the first surface 21 of the substrate 2. The shallow trench isolation (STI) 24 may be disposed around the transistor 30. The ion implantation regions 25 may surround the photodiode regions 23. In some embodiments, the substrate 2, the transistor 30, the ion implantation regions 25, and the shallow trench isolations (STIs) 24 of FIG. 13 have the same or similar configurations as the substrate 2, the transistor 30, the ion implantation regions 25, and the shallow trench isolations (STIs) 24 of FIG. 1, respectively.

Figure 14:
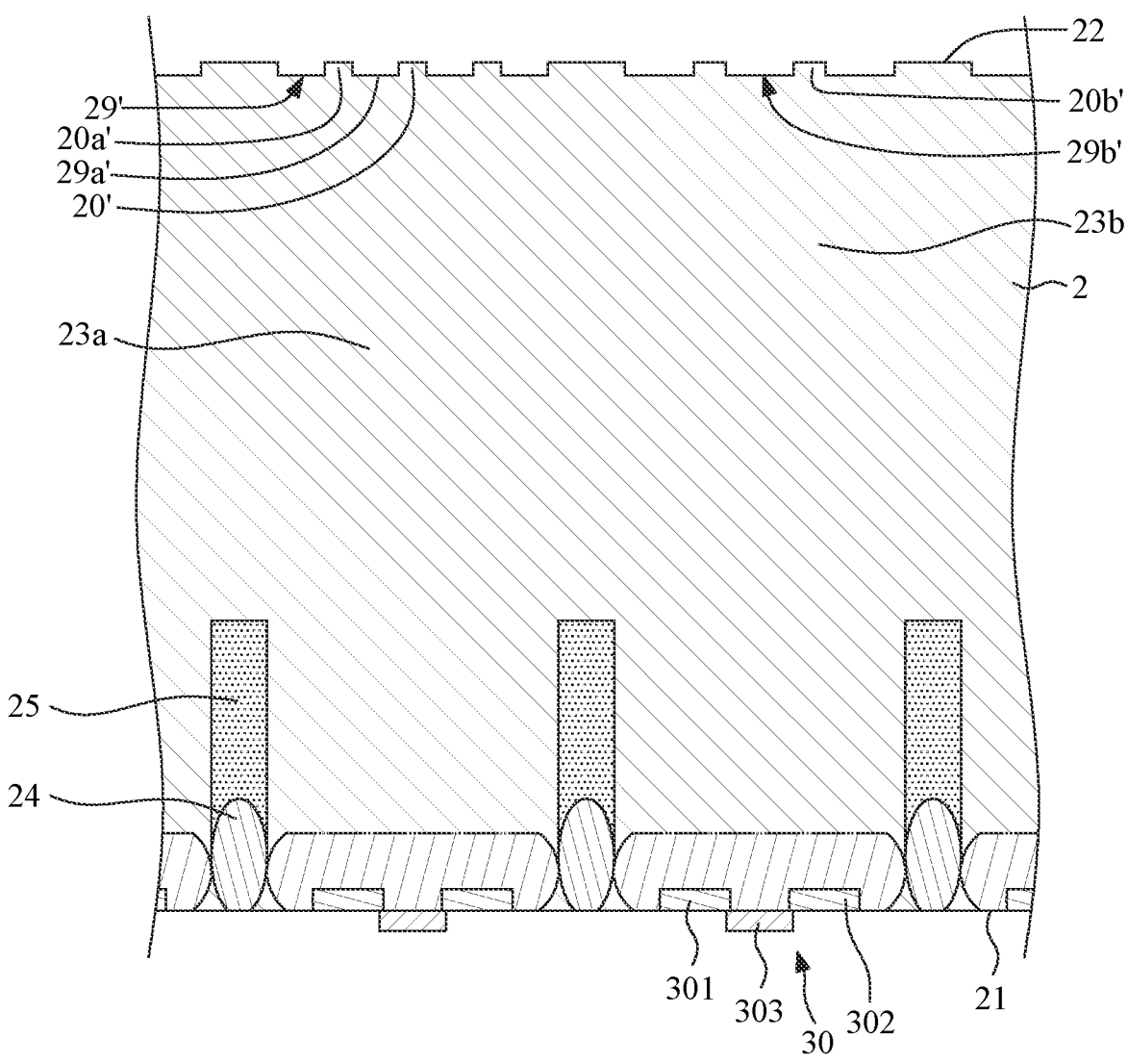

Referring to FIG. 14, a plurality of recesses 29' may be formed on the second surface 22 of the substrate 2 through, for example, a first etching process. Thus, the recesses 29' may be recessed from the second surface 22 of the substrate 2. The recesses 29' define a plurality of pillars 20'. The recesses 29' include a plurality of first recesses 29*a*' and a plurality of second recesses 29*b*'. The first recesses 29*a*' define a plurality of first pillars 20*a*' corresponding to the first photodiode region 23*a*. The second recesses 29*b*' define a plurality of second pillars 20*b*' corresponding to the second photodiode region 23*b*.

Figure 15:
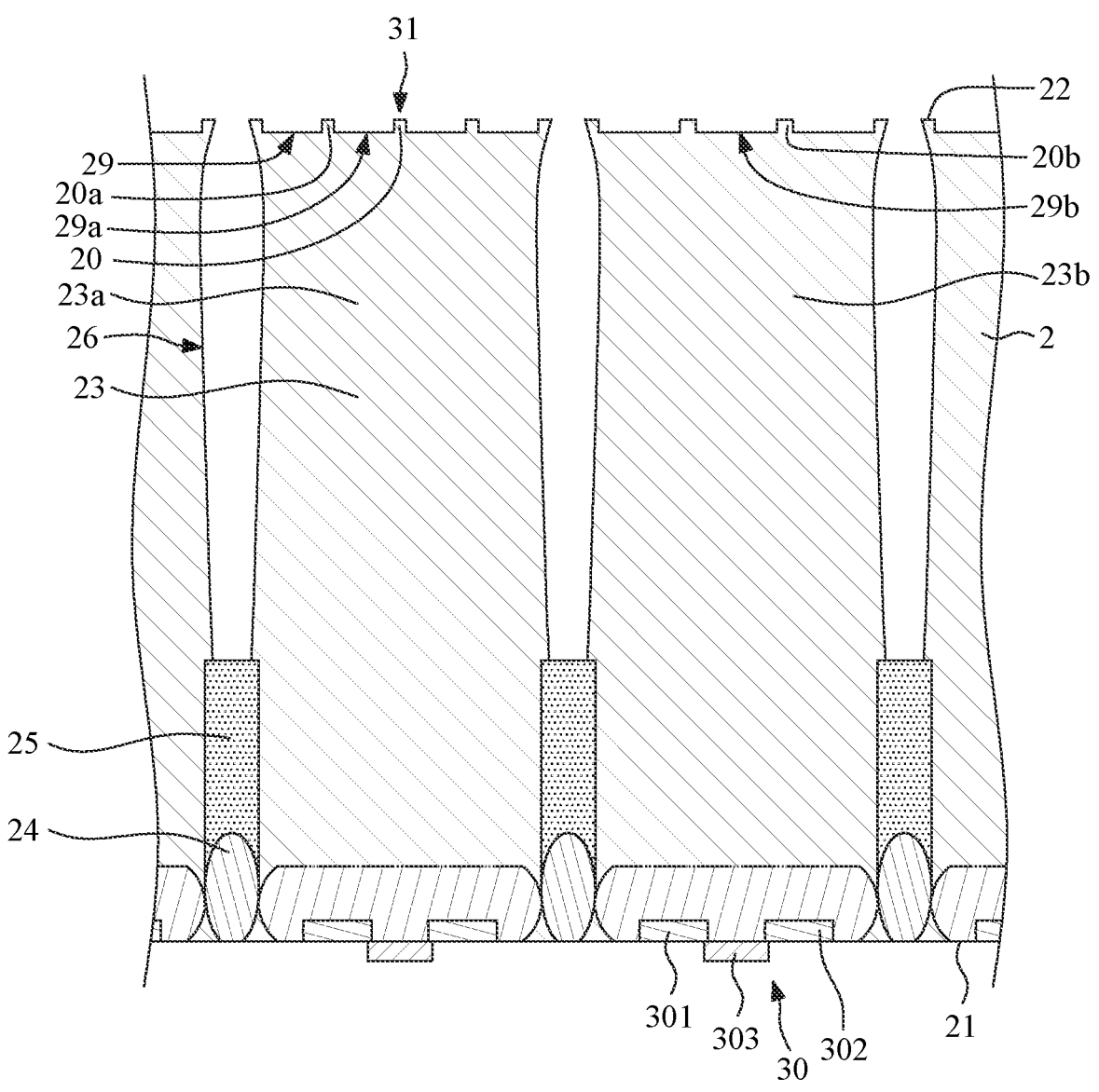

Referring to FIG. 15, a second etching process may be conducted to the second surface 22 of the substrate 2 to form a trench 26 and a plurality of recesses 29 in the substrate 2. The trench 26 may surround the photodiode regions 23, and may expose a portion of the ion implantation region 25. The recesses 29 define a plurality of pillars 20. In some embodiments, the recesses 29 of FIG. 15 may be formed from the recesses 29' of FIG. 14. Thus, the recesses 29 define a plurality of pillars 20 disposed over the photodiode regions 23. The recesses 29 include a plurality of first recesses 29*a* and a plurality of second recesses 29*b*. The first recesses 29*a* of FIG. 15 may be formed from the first recesses 29*a*' of FIG. 14. The first recesses 29*a* define a plurality of first pillars 20*a* corresponding to the first photodiode region 23*a*. Similarly, the second recesses 29*b* of FIG. 15 may be formed from the second recesses 29*b*' of FIG. 14. The second recesses 29*b* define a plurality of second pillars 20*b* corresponding to the second photodiode region 23*b*. Meanwhile, the pillars 20 (including the first pillars 20*a* and the second pillars 20*b*) may be an example of an anti-reflection structure 31.

Figure 16:
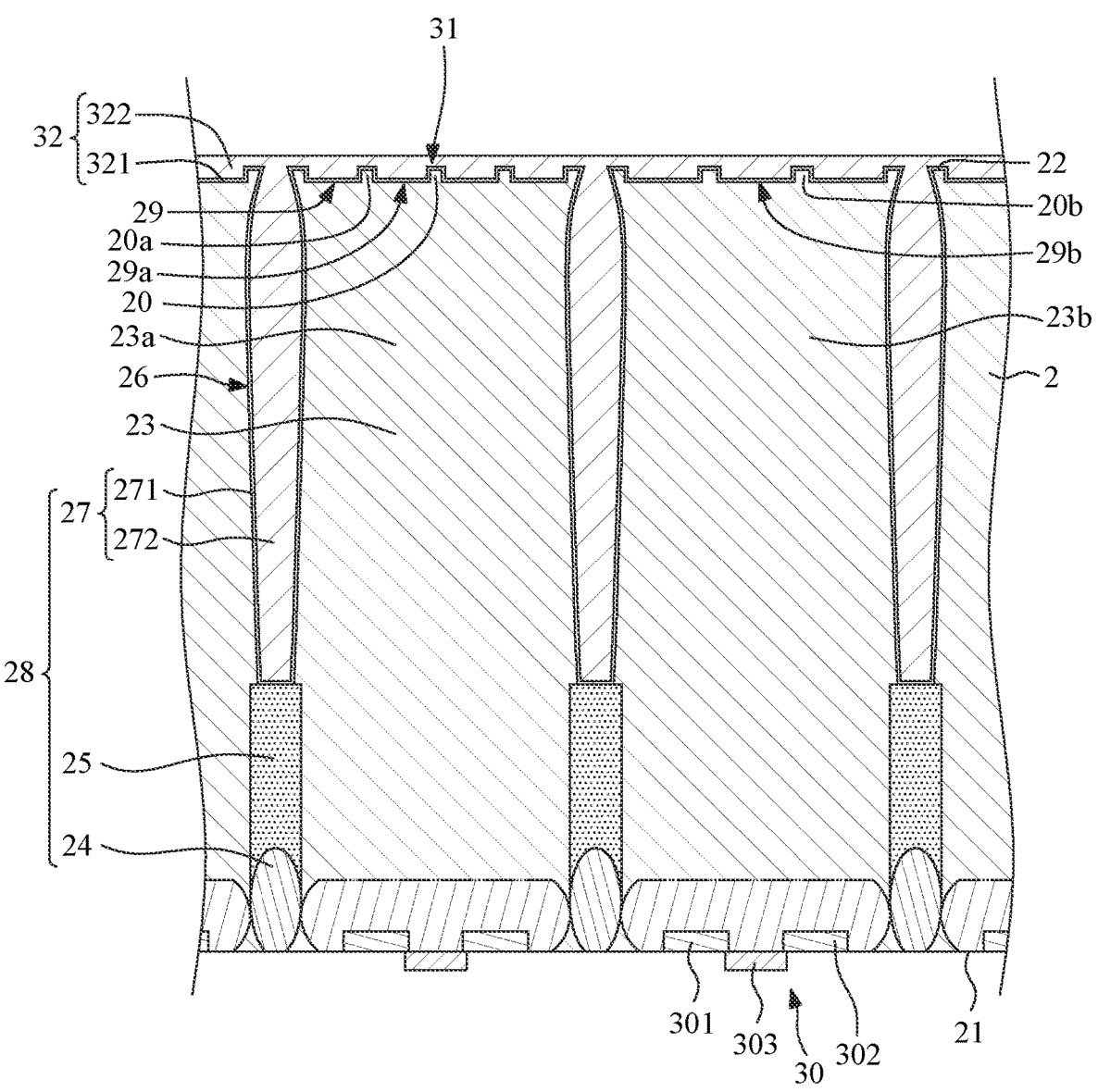

Referring to FIG. 16, a material 32 may be formed or disposed to cover the pillars 20 (including the first pillars 20*a* and the second pillars 20*b*). A portion of the material 32 may extend into and fill the trench 26 to form a plurality of deep trench isolations (DTIs) 27. The material 32 may include a base film 321 and a main portion 322. The base film 321 may be conformal with the pillars 20 (the first pillars 20*a* and the second pillars 20*b*) and the recesses 29 (the first recesses 29*a* and the second recesses 29*b*). The main portion 322 may be disposed on the base film 321. In some embodiments, the deep trench isolation (DTI) 27 includes a portion of the material 32. That is, a base film 271 of the deep trench isolation (DTI) 27 and the base film 321 of the material 32 are the same layer and are formed concurrently. Similarly, a main portion 272 of the deep trench isolation (DTI) 27 and the main portion 322 of the material 32 are the same layer and are formed concurrently. Meanwhile, the deep trench isolations (DTIs) 27, the ion implantation regions 25 and the shallow trench isolations (STIs) 24 are aligned with each other to form an isolation structure 28 in the substrate 2 and surrounding the photodiode region 23. In some embodiments, the material 32 and the isolation structure 28 of FIG. 16 are the same as or similar to the material 32 and the isolation structure 28 of FIG. 1, respectively.

Figure 17:
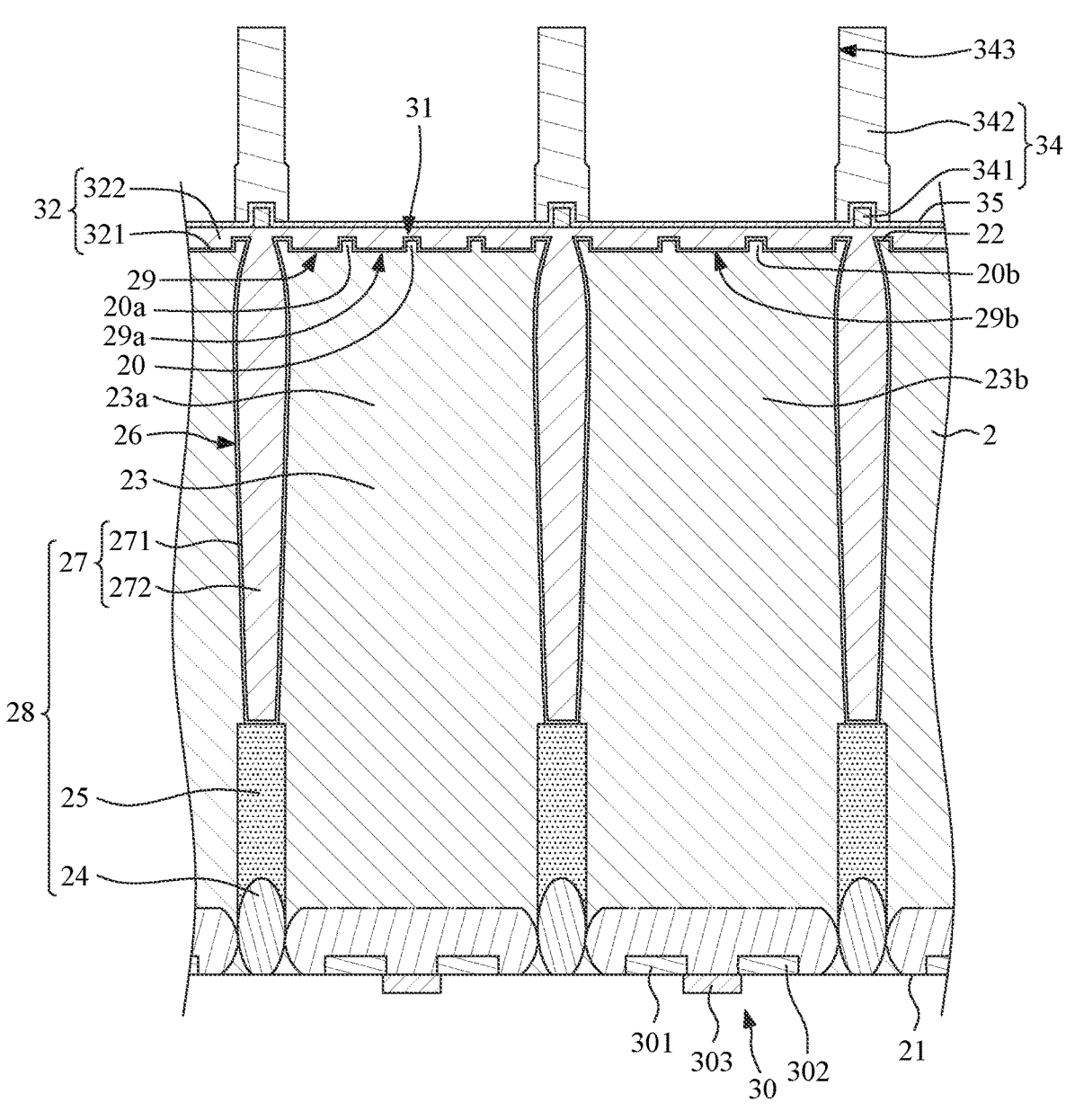

Referring to FIG. 17, a grid structure 34 may be formed or disposed over the material 32 and aligned with the isolation structure 28. The grid structure 34 may include a base grid 341 and a dielectric grid 342. The base grid 341 may be disposed over the isolation structure 28, and may align with and overlap the isolation structure 28. In addition, the dielectric grid 342 may be disposed over the base grid 341, and may align with and overlap the base grid 341. Thus, the dielectric grid 342 may align with and overlap the isolation structure 28. In some embodiments, the base grid 341 may be formed on the material 32. Then, a protecting layer 35 may be formed or disposed to cover and contact the base grid 341 and the material 32. Then, the dielectric grid 342 may be formed or disposed to cover and contact a portion of the protecting layer 35 that covers the base grid 341. In some embodiments, the grid structure 34 and the protecting layer 35 of FIG. 17 have the same or similar configuration as the grid structure 34 and the protecting layer 35 of FIG. 1, respectively. The grid structure 34 may define at least one space 343.

Figure 18:
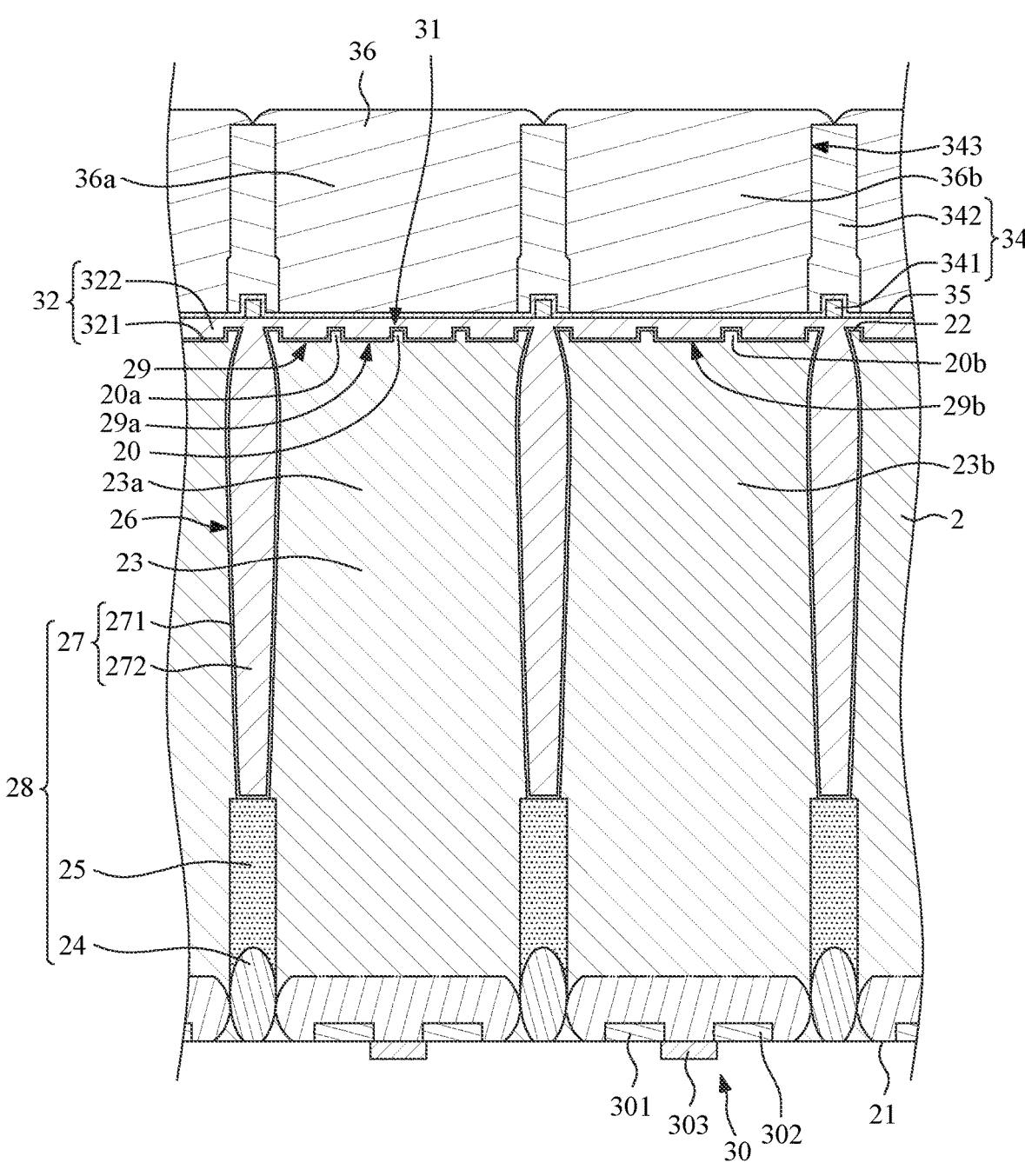

Referring to FIG. 18, at least one optical element 36 is formed or disposed over the anti-reflection structure 31 (e.g., the pillars 20) and in the space 343 defined by the grid structure 34. Thus, the at least one optical element 36 is disposed over the substrate 2, and may correspond to or may be aligned with the photodiode region 23. In some embodiments, the at least one optical element 36 includes a first optical element 36a and a second optical element 36b disposed over the anti-reflection structure 31 and surrounded by the grid structure 34. For example, the first optical element 36a may be a first color filter 36a disposed on the protecting layer 35, and the second optical element 36b may be a second color filter 36b disposed on the protecting layer 35. The first color filter 36a may be aligned with the first photodiode region 23a, and the second color filter 36b may be aligned with the second photodiode region 23b.

Then, at least one micro lens 38 may be formed or disposed on the optical element 36 so as to obtain the semiconductor image-sensing structure 1 of FIG. 1.

FIG. 19 illustrates a flow chart of a method 50 of manufacturing a semiconductor device 1 in accordance with some embodiments of the present disclosure.

In some embodiments, the method 50 includes a step S51, forming an isolation structure and a plurality of pillars in a substrate, wherein the isolation structure surrounds at least one photodiode region in the substrate, and the plurality of pillars are disposed over the at least one photodiode region. For example, as shown in FIG. 16, an isolation structure 28 and a plurality of pillars 20 are formed in a substrate 2. The isolation structure 28 surrounds at least one photodiode region 23 in the substrate 2. The pillars 20 are disposed over the photodiode region 23.

In some embodiments, the method 50 includes a step S52, forming at least one optical element over the plurality of pillars and corresponding to the at least one photodiode region. For example, as shown in FIG. 18, at least one optical element 36 is formed over the pillars 20 and corresponds to the photodiode region 23.

The present disclosure therefore provides a semiconductor image-sensing structure including a substrate, an isolation structure, an anti-reflection structure, at least one optical element and a transistor. The substrate has at least one photodiode region. The isolation structure is disposed in the substrate and surrounds the photodiode region. The anti-reflection structure covers the photodiode region. The optical element is disposed over the anti-reflection structure and corresponds to the photodiode region. The transistor is disposed under the photodiode region.

The present disclosure therefore provides a semiconductor image-sensing structure including a substrate, an isolation structure, at least one optical element and a plurality of pillars. The substrate has at least one photodiode region. The isolation structure is disposed in the substrate and surrounds the photodiode region. The optical element is disposed over the substrate and corresponds to the photodiode region. The pillars are disposed between the photodiode region and the optical element. The pillars are configured to reduce a reflection of a light from the optical element.

In some embodiments, a method for forming a semiconductor image-sensing structure is provided. The method includes following operations: forming an isolation structure and a plurality of pillars in a substrate, wherein the isolation structure surrounds at least one photodiode region in the substrate, and the plurality of pillars are disposed over the at least one photodiode region; and forming at least one optical element over the plurality of pillars and corresponding to the at least one photodiode region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor image-sensing structure, comprising:
   a substrate having at least one photodiode region;
   an isolation structure disposed in the substrate and surrounding the at least one photodiode region;
   an anti-reflection structure covering the photodiode region;
   at least one optical element disposed over the anti-reflection structure and corresponding to the at least one photodiode region;
   a base grid disposed above a top of the isolation structure, wherein a protecting layer that is formed between the anti-reflection structure and the at least one optical element encloses the base grid; and
   a transistor disposed under the at least one photodiode region.

2. The semiconductor image-sensing structure of claim 1, wherein the anti-reflection structure includes a plurality of pillars.

3. The semiconductor image-sensing structure of claim 2, wherein the substrate defines a plurality of recesses over the at least one photodiode region to form the plurality of pillars.

4. The semiconductor image-sensing structure of claim 2, further comprising a material covering the anti-reflection structure, wherein the material includes a base film and a main portion, the base film is conformal with the plurality of pillars, and the main portion is disposed on the base film.

5. The semiconductor image-sensing structure of claim 4, wherein the base film includes a first layer disposed over the plurality of pillars, a second layer disposed over the first layer and a third layer disposed over the second layer.

6. The semiconductor image-sensing structure of claim 5, wherein the first layer includes $Al_2O_3$, the second layer includes HfO, and the third layer includes $Ta_2O_5$.

7. The semiconductor image-sensing structure of claim 4, wherein the main portion includes silicon oxide or tungsten.

8. The semiconductor image-sensing structure of claim 4, wherein the isolation structure includes a plurality of deep trench isolations (DTIs), and the plurality of deep trench isolations (DTIs) include a portion of the material.

9. The semiconductor image-sensing structure of claim 1, wherein the isolation structure includes a plurality of deep trench isolations (DTIs), a plurality of ion implantation regions and a plurality of shallow trench isolations (STIs) connecting to one and another.

10. The semiconductor image-sensing structure of claim 1, further comprising a grid structure disposed over the anti-reflection structure and aligned with the isolation structure, wherein the grid structure includes the base grid and a dielectric grid over the base grid.

11. The semiconductor image-sensing structure of claim 10, wherein the at least one optical element includes at least one color filter disposed over the anti-reflection structure and surrounded by the grid structure.

12. A semiconductor image-sensing structure, comprising:

a substrate having at least one photodiode region;

an isolation structure disposed in the substrate and surrounding the at least one photodiode region;

at least one optical element disposed over the substrate and corresponding to the at least one photodiode region;

a plurality of pillars disposed between the at least one photodiode region and the at least one optical element, wherein the plurality of pillars are configured to reduce a reflection of a light from the at least one optical element; and a base grid disposed over the anti-reflection structure, wherein a protecting layer is formed between the at least one optical element and the plurality of pillars, and the protecting layer covers a top surface and sidewalls of the base grid.

13. The semiconductor image-sensing structure of claim 12, wherein a pitch between the plurality of pillars is less than a wavelength of the light from the at least one optical element.

14. The semiconductor image-sensing structure of claim 12, wherein the at least one optical element includes a first optical element and a second optical element, the plurality of pillars include a plurality of first pillars under the first optical element and a plurality of second pillars under the second optical element, wherein a number of the first pillars is different from a number of the second pillars.

15. The semiconductor image-sensing structure of claim 14, wherein a pitch between the first pillars is different from a pitch between the second pillars.

16. The semiconductor image-sensing structure of claim 12, wherein a shape of a cross section of each of the plurality of pillars includes one of a square, a rectangle, and a triangle.

17. A method of manufacturing a semiconductor image-sensing structure, comprising:

patterning a surface of a substrate to form a plurality of pillars;

forming an isolation structure in the substrate, wherein the isolation structure surrounds at least one photodiode region in the substrate, and the plurality of pillars are disposed over the at least one photodiode region;

forming a base grid disposed above a top of the isolation structure;

forming a protecting layer above the plurality of pillars and atop the base grid to cover the base grid; and forming at least one optical element on the protecting layer, wherein the at least one optical element is positioned over the plurality of pillars and corresponding to the at least one photodiode region.

18. The method of claim 17, wherein forming the isolation structure and the plurality of pillars includes:

forming a trench and a plurality of recesses in the substrate, wherein the trench surrounds the at least one photodiode region, and the recesses define the plurality of pillars; and forming a material to cover the plurality of pillars, wherein a portion of the material fills the trench to form the isolation structure.

19. The method of claim 18, further comprising:

forming a grid structure over the material and aligned with the isolation structure, wherein the grid structure includes the base grid and a dielectric grid over the base grid.

20. The method of claim 19, further comprising:

forming the at least one optical element in a space defined by the grid structure.

* * * * *